United States Patent
Kim et al.

(10) Patent No.: US 12,557,316 B2
(45) Date of Patent: *Feb. 17, 2026

(54) SEMICONDUCTOR DEVICE HAVING ACTIVE REGIONS WITH DIFFERENT WIDTHS AND POWER LINES THEREOVER

(71) Applicant: Samsung Electronics Co., Ltd., Suwon-si (KR)

(72) Inventors: Taehyung Kim, Hwaseong-si (KR); Kwanyoung Chun, Suwon-si (KR); Yoonjin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 738 days.

This patent is subject to a terminal disclaimer.

(21) Appl. No.: 17/960,277

(22) Filed: Oct. 5, 2022

(65) Prior Publication Data

US 2023/0022952 A1  Jan. 26, 2023

Related U.S. Application Data

(63) Continuation of application No. 16/730,172, filed on Dec. 30, 2019, now Pat. No. 11,522,071.

(51) Int. Cl.
*H10D 30/01*  (2025.01)
*H01L 21/02*  (2006.01)
(Continued)

(52) U.S. Cl.
CPC ..... *H10D 30/024* (2025.01); *H01L 21/02532* (2013.01); *H01L 21/76897* (2013.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS 8,872,161 B1  10/2014  Ching et al.
9,425,201 B2  8/2016  Liaw
(Continued)

FOREIGN PATENT DOCUMENTS

CN  108630684 A  10/2018
CN  108695378 A  10/2018
(Continued)

OTHER PUBLICATIONS

Korean Notice of Allowance dated Feb. 27, 2025 issued in Korean Patent Application No. 10-2019-0068761.
(Continued)

*Primary Examiner* — Younes Boulghassoul
(74) *Attorney, Agent, or Firm* — Fish & Richardson P.C.

(57) ABSTRACT

Disclosed is a semiconductor device comprising an active region that protrudes upwardly from a substrate, a plurality of channel patterns that are spaced apart from each other in a first direction on the active region, and a gate electrode that extends in the first direction on the active region and covers the plurality of channel patterns. Each of the plurality of channel patterns includes a plurality of semiconductor patterns that are spaced apart from each other in a direction perpendicular to a top surface of the active region. The gate electrode covers the top surface of the active region between the plurality of channel patterns.

19 Claims, 39 Drawing Sheets

(51) Int. Cl.
*H01L 21/768* (2006.01)
*H10D 30/62* (2025.01)
*H10D 30/67* (2025.01)
*H10D 62/10* (2025.01)
*H10D 62/13* (2025.01)
*H10D 64/01* (2025.01)
*H10D 64/27* (2025.01)
*H10D 84/01* (2025.01)
*H10D 84/03* (2025.01)

(52) U.S. Cl.
CPC ......... *H10D 30/62* (2025.01); *H10D 30/6735* (2025.01); *H10D 30/6757* (2025.01); *H10D 62/115* (2025.01); *H10D 62/117* (2025.01); *H10D 62/151* (2025.01); *H10D 64/017* (2025.01); *H10D 64/511* (2025.01); *H10D 84/0135* (2025.01); *H10D 84/0151* (2025.01); *H10D 84/038* (2025.01)

(58) Field of Classification Search
CPC ..... H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 84/0165–0195; H10D 84/85–859; H10D 84/907; H10D 84/0126; H10D 84/0128; H10D 84/8311; H10D 84/981; H10B 12/36; H10B 12/056; H01L 23/5286
See application file for complete search history.

(56) References Cited

U.S. PATENT DOCUMENTS

| | | | |
|---|---|---|---|
| 9,620,509 B1 | 4/2017 | Pao et al. | |
| 9,660,033 B1 | 5/2017 | Chen et al. | |
| 9,871,103 B2 | 1/2018 | Kim et al. | |
| 9,929,235 B1 | 3/2018 | Yang et al. | |
| 9,935,014 B1 | 4/2018 | Cheng et al. | |
| 10,014,389 B2 | 7/2018 | Xie et al. | |
| 10,096,688 B2 | 10/2018 | Tak et al. | |
| 10,185,798 B2 | 1/2019 | Kim et al. | |
| 10,186,510 B2 | 1/2019 | Schultz | |
| 10,211,322 B1 | 2/2019 | Kim et al. | |
| 10,461,195 B2 | 10/2019 | Kwon et al. | |
| 10,490,559 B1 | 11/2019 | Ando et al. | |
| 10,714,476 B2 | 7/2020 | Kim et al. | |
| 10,714,617 B2 | 7/2020 | Yang et al. | |
| 10,872,825 B2 | 12/2020 | Chiang et al. | |
| 10,930,649 B2 | 2/2021 | Kang et al. | |
| 11,522,071 B2 * | 12/2022 | Kim | H10D 84/0128 |
| 11,664,379 B2 | 5/2023 | Lee et al. | |
| 2005/0104140 A1 | 5/2005 | Pan et al. | |
| 2015/0370949 A1 | 12/2015 | Moroz et al. | |
| 2016/0056083 A1 * | 2/2016 | Do | H01L 21/0274 438/586 |
| 2017/0140933 A1 | 5/2017 | Lee et al. | |
| 2017/0154973 A1 | 6/2017 | Ching et al. | |
| 2017/0200651 A1 | 7/2017 | Lee et al. | |
| 2017/0229456 A1 | 8/2017 | Sharma et al. | |
| 2018/0182846 A1 * | 6/2018 | Kang | H10D 84/017 |
| 2018/0277543 A1 | 9/2018 | Kim et al. | |
| 2018/0366589 A1 | 12/2018 | Shimbo | |
| 2019/0006485 A1 | 1/2019 | Kim et al. | |
| 2019/0131415 A1 | 5/2019 | Cheng et al. | |
| 2019/0139955 A1 * | 5/2019 | Kim | H10D 62/115 |
| 2019/0165114 A1 | 5/2019 | Lee et al. | |
| 2019/0198530 A1 | 6/2019 | Hino et al. | |
| 2019/0268000 A1 * | 8/2019 | Song | H10D 62/116 |
| 2019/0288117 A1 | 9/2019 | Xie et al. | |
| 2020/0051869 A1 | 2/2020 | Chiang et al. | |
| 2020/0075595 A1 * | 3/2020 | Shin | H01L 21/76897 |
| 2020/0105761 A1 | 4/2020 | Liaw | |
| 2020/0161334 A1 * | 5/2020 | Seo | H10D 84/85 |
| 2020/0168715 A1 | 5/2020 | Wu et al. | |
| 2020/0176597 A1 | 6/2020 | Vellianitis et al. | |
| 2020/0294865 A1 | 9/2020 | Cheng et al. | |
| 2020/0343387 A1 | 10/2020 | Liaw | |
| 2020/0388681 A1 | 12/2020 | Yamashita et al. | |
| 2021/0151601 A1 | 5/2021 | Miao et al. | |

FOREIGN PATENT DOCUMENTS

| | | |
|---|---|---|
| CN | 109427900 A | 3/2019 |
| CN | 109860298 A | 6/2019 |
| CN | 110690216 A | 1/2020 |
| KR | 10-2017-0015651 A | 2/2017 |
| KR | 10-2017-0044525 A | 4/2017 |
| KR | 10-2020-0029264 A | 3/2020 |
| KR | 10-2020-0137256 A | 12/2020 |

OTHER PUBLICATIONS

Office Action dated Jun. 8, 2021 for corresponding U.S. Appl. No. 16/730,172.

* cited by examiner

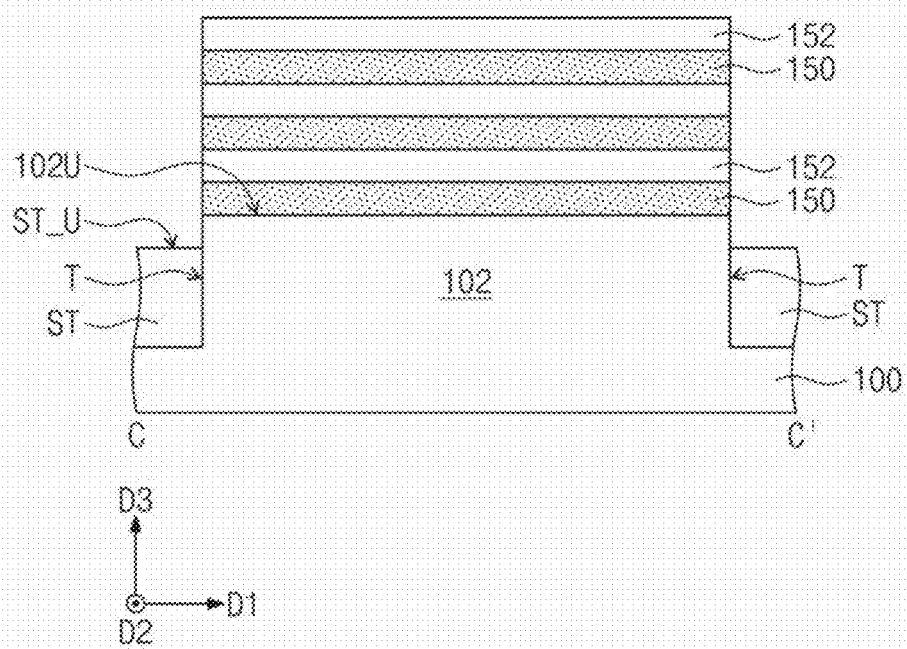

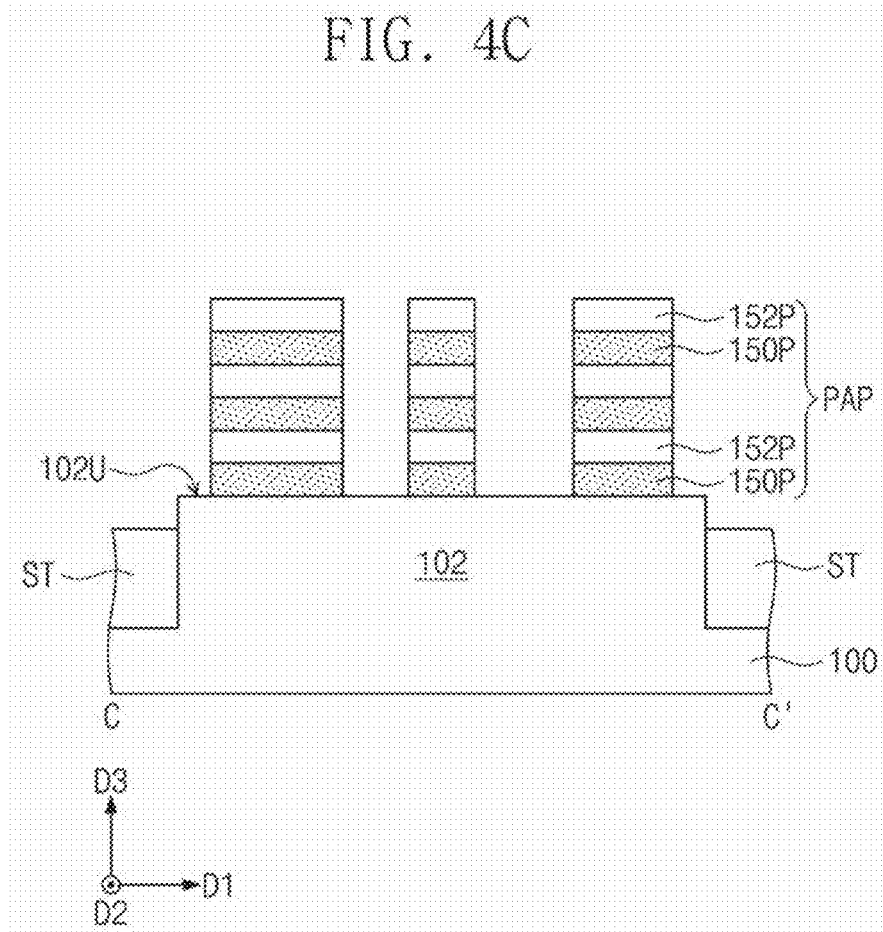

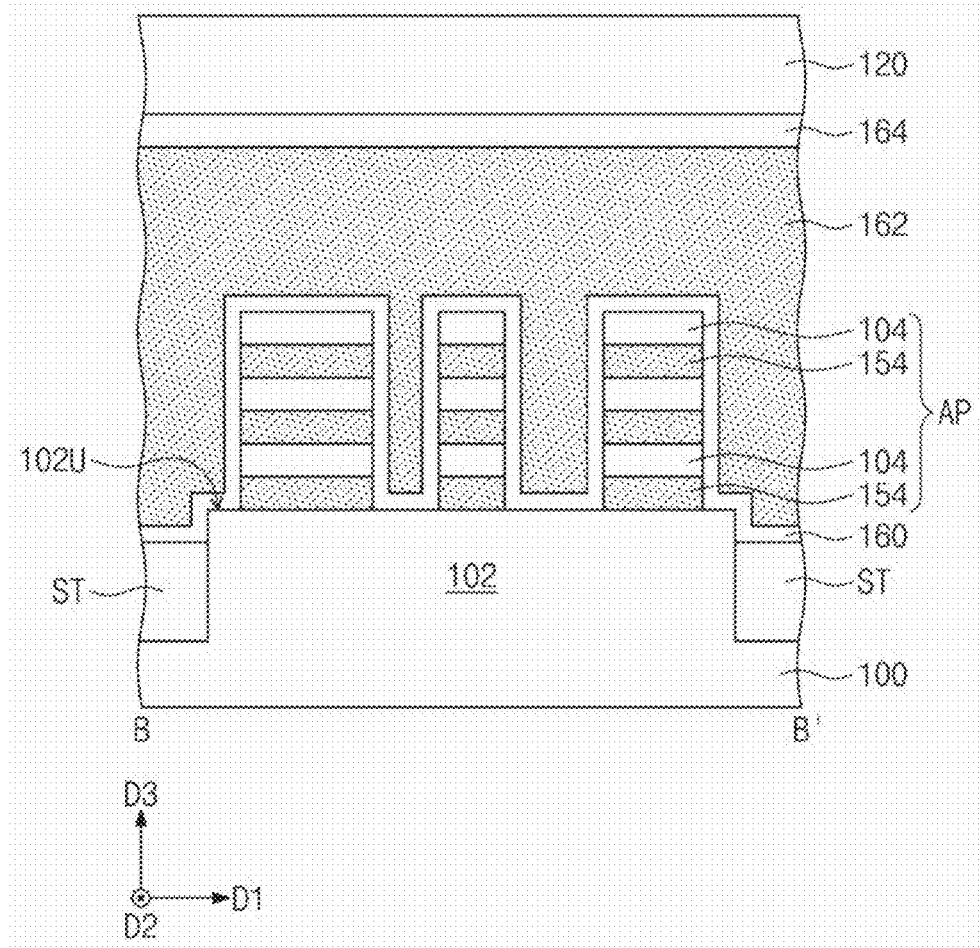

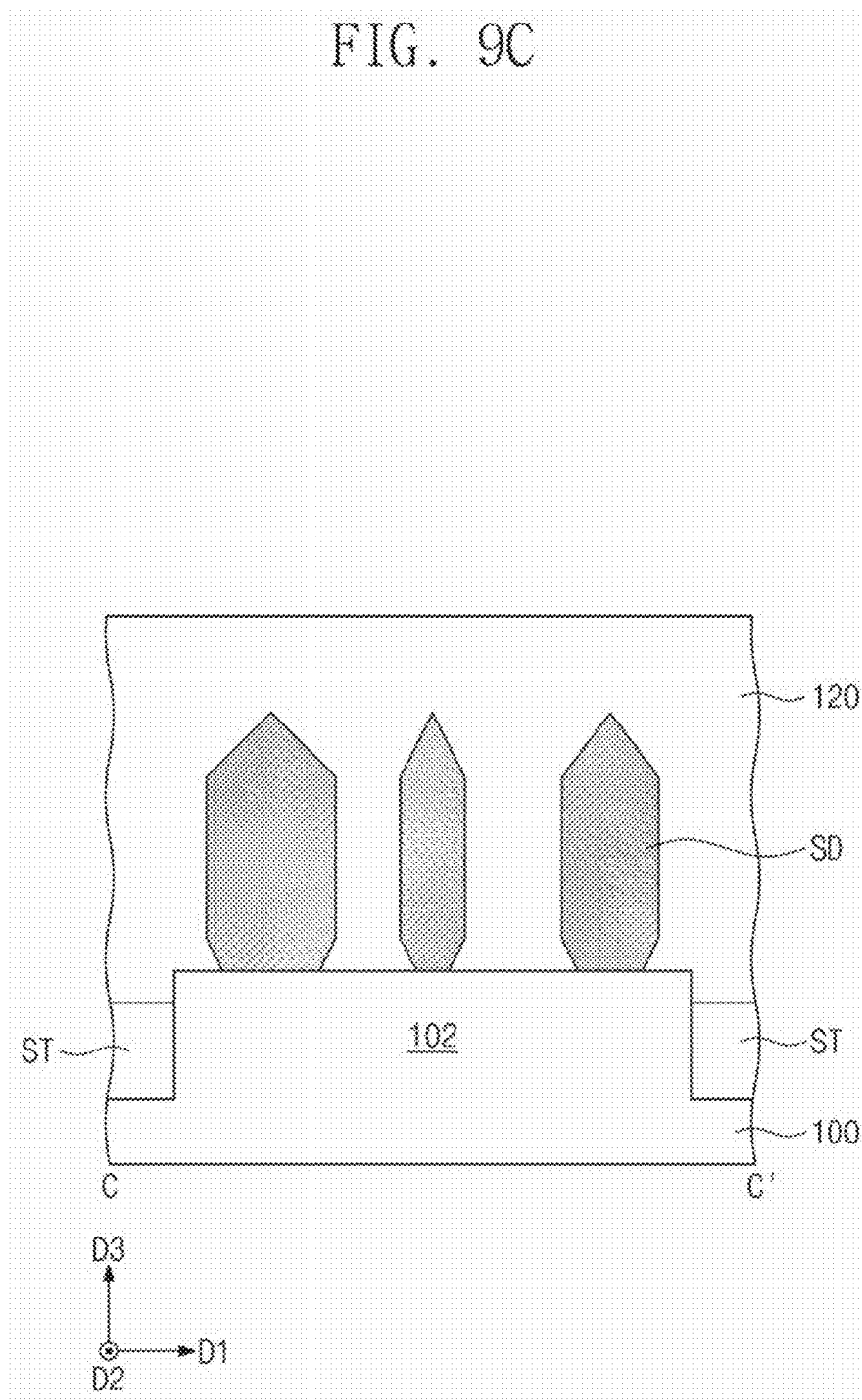

… (1)

SEMICONDUCTOR DEVICE HAVING ACTIVE REGIONS WITH DIFFERENT WIDTHS AND POWER LINES THEREOVER

CROSS-REFERENCE TO RELATED APPLICATION

The present application is a continuation of and claims priority under 35 U.S.C. § 120 to U.S. patent application Ser. No. 16/730,172, filed on Dec. 30, 2019, which hereby claims priority under 35 U.S.C. § 119 to Korean Patent Application No. 10-2019-0068761 filed on Jun. 11, 2019 in the Korean Intellectual Property Office, the entire contents of which are hereby incorporated by reference.

BACKGROUND

Inventive concepts relate to a semiconductor device, and more particularly, to a semiconductor device including a fin field effect transistor.

A semiconductor device includes an integrated circuit consisting of or including metal oxide semiconductor field effect transistors (MOSFETs). As sizes and design rules of the semiconductor device are gradually decreased, sizes of the MOSFETs are also increasingly scaled down. The decrease in size of MOSFETs may deteriorate operating/electrical characteristics of the semiconductor device. Accordingly, research has been developed to manufacture/fabricate a semiconductor device having excellent or improved performance, while overcoming limitations due to integration of the semiconductor device.

SUMMARY

Some example embodiments of inventive concepts provide a semiconductor device that may be more efficiently and/or easily fabricated.

Some example embodiments of inventive concepts provide a semiconductor device with an increased degree of freedom of integrated circuit design.

According to some example embodiments of inventive concepts, a semiconductor device may comprise an active region protruding upwardly from a substrate, a plurality of channel patterns on the active region, the plurality of channel patterns spaced apart from each other in a first direction, and a gate electrode on the active region, the gate electrode extending in the first direction and surrounding the plurality of channel patterns. Each of the plurality of channel patterns includes a plurality of semiconductor patterns spaced apart from each other in a direction perpendicular to a top surface of the active region. The gate electrode covers the top surface of the active region between the plurality of channel patterns.

According to some example embodiments of inventive concepts, a semiconductor device may comprise a device isolation pattern on a substrate, a first active region and a second active region across the device isolation pattern, the first active region and the second active region protruding upwardly from the substrate and spaced apart from each other in a first direction, a plurality of first channel patterns on the first active region, the plurality of first channel patterns spaced apart from each other in the first direction, at least one second channel pattern on the second active region, and a gate electrode extending in the first direction running across the first and second active regions, the gate electrode surrounding the plurality of first channel patterns and the at least one second channel pattern. Each of the plurality of first channel patterns includes a plurality of first semiconductor patterns that are spaced apart from each other in a direction perpendicular to a top surface of the first active region. The at least one second channel pattern includes a plurality of second semiconductor patterns that are spaced apart from each other in a direction perpendicular to a top surface of the second active region.

DETAILED DESCRIPTION OF EXAMPLE EMBODIMENTS

Some example embodiments of inventive concepts will be described below in detail in conjunction with the accompanying drawings to aid in clearly understanding inventive concepts.

Figure 1:
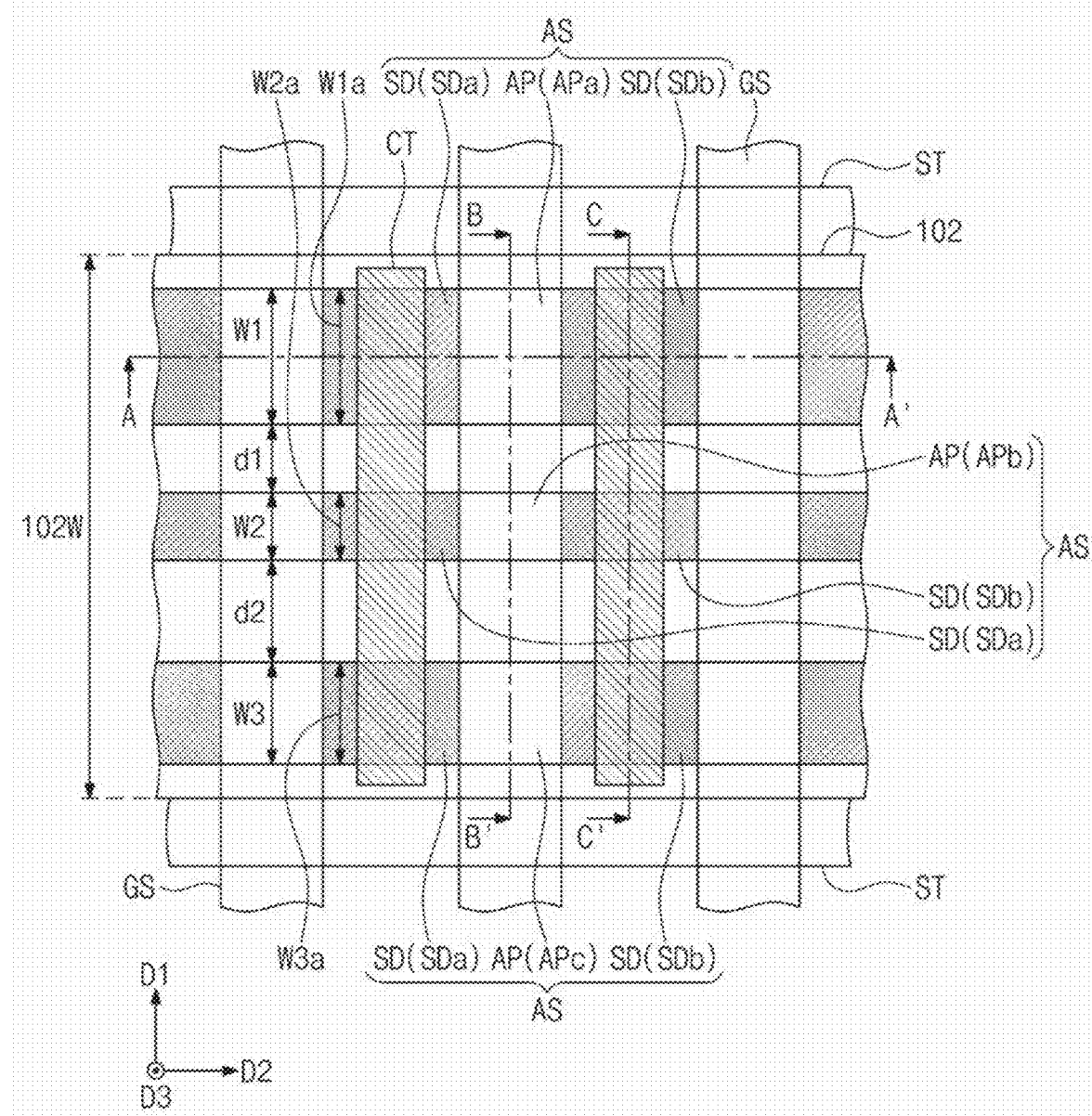
FIG. 1 illustrates a plan view showing a semiconductor device according to some example embodiments of inventive concepts.
Figure 2A:
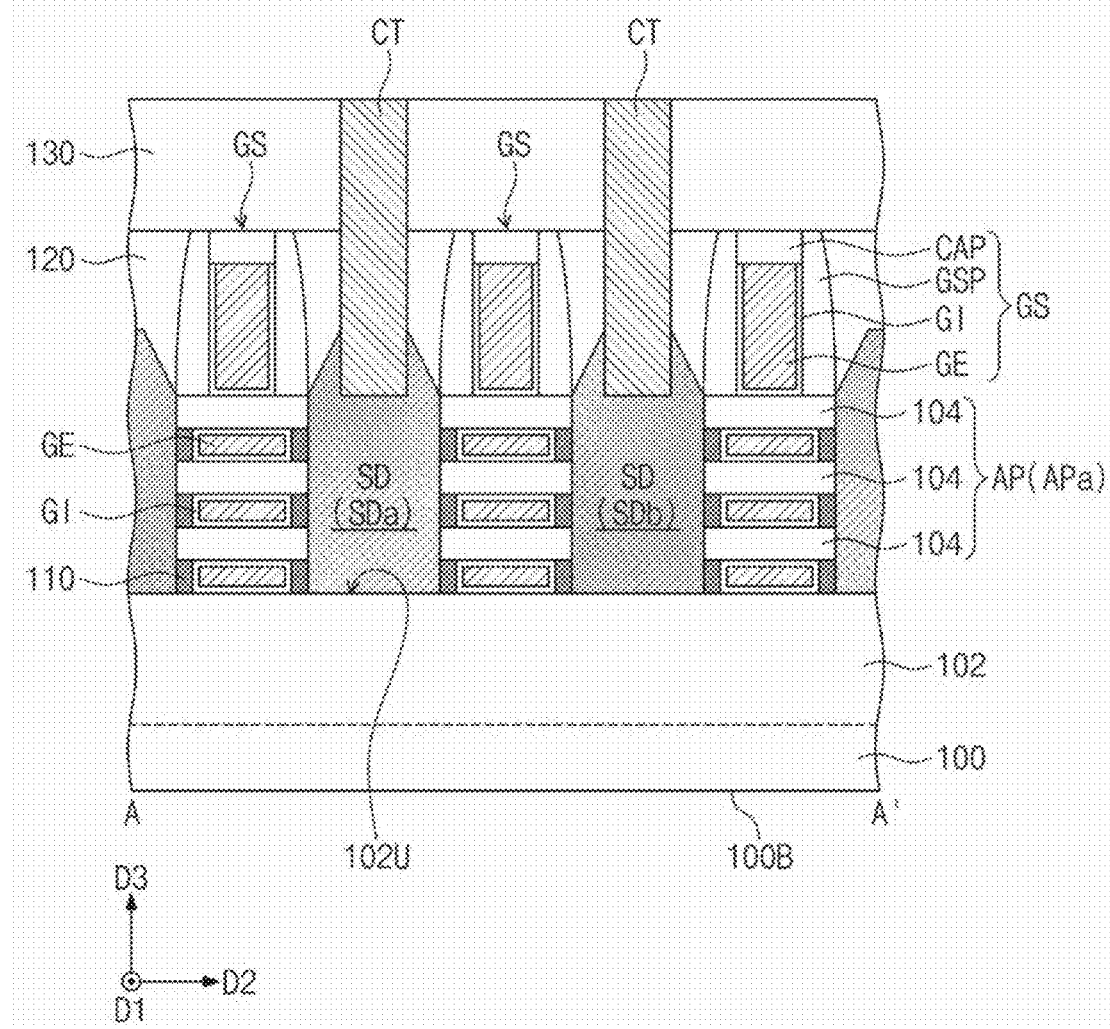
FIGS. 2A, 2B, and 2C illustrate cross-sectional views respectively taken along lines A-A', B-B', and C-C' of FIG. 1.
Figure 2B:
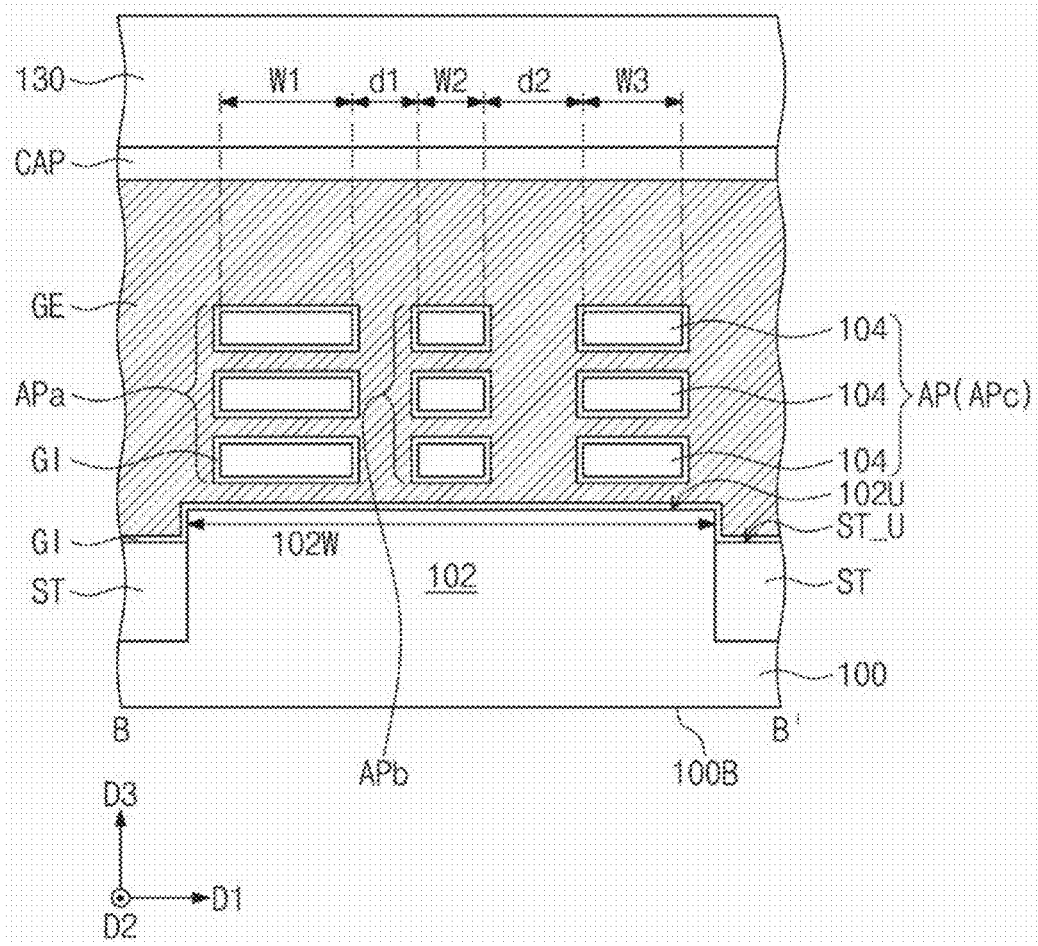
Figure 2C:
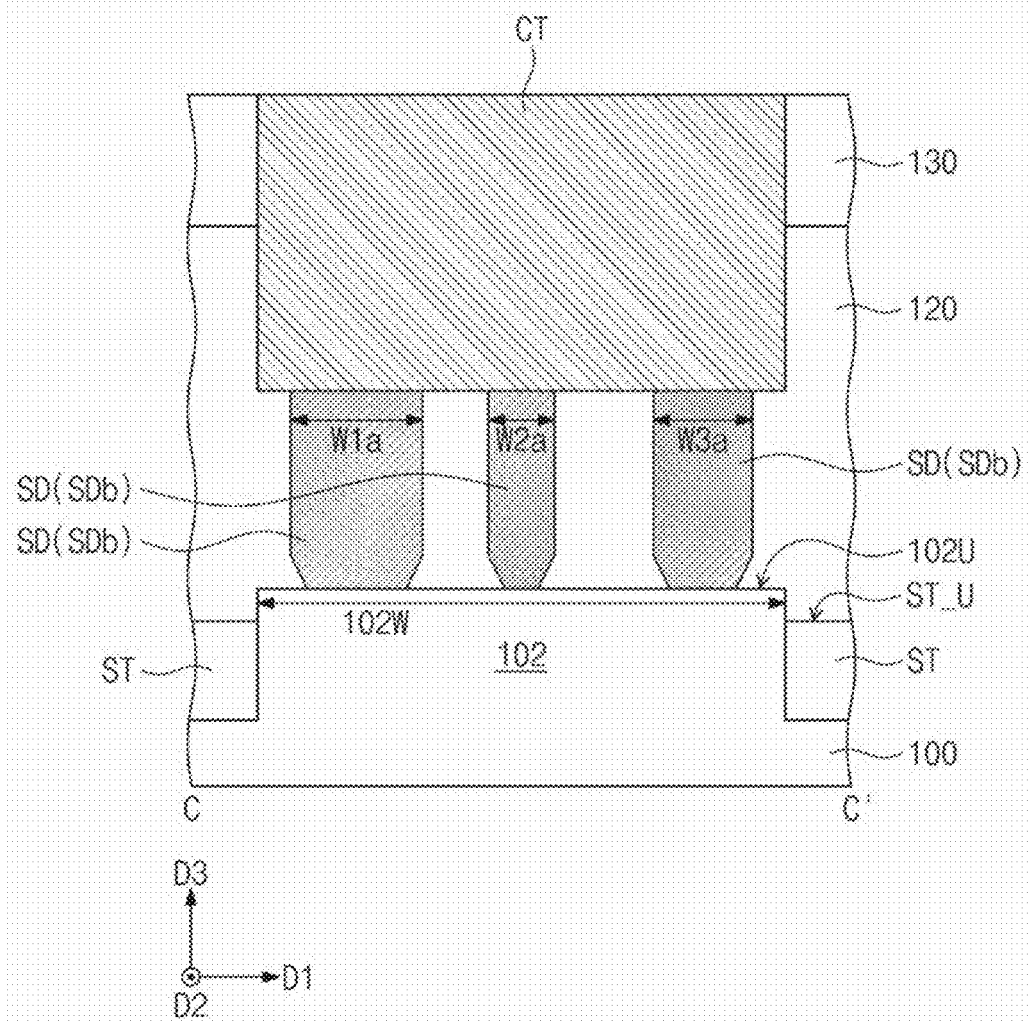
Figure 3A:
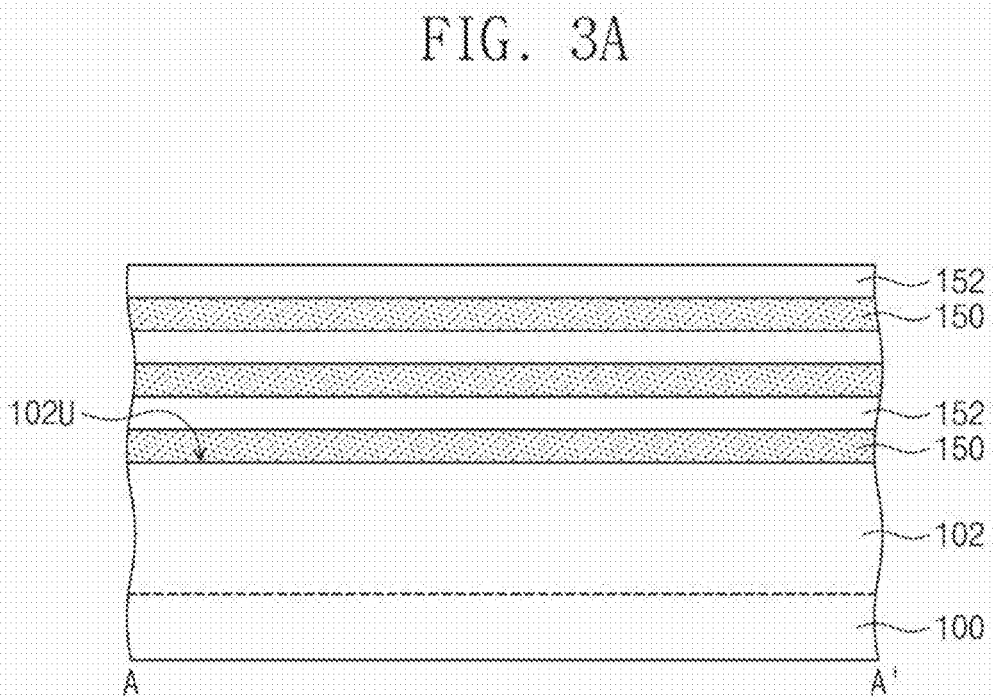
FIGS. 3A to 9C illustrate cross-sectional views respectively taken along lines A-A', B-B', and C-C' of FIG. 1, showing a method of fabricating a semiconductor device according to some example embodiments of inventive concepts.
Figure 3B:
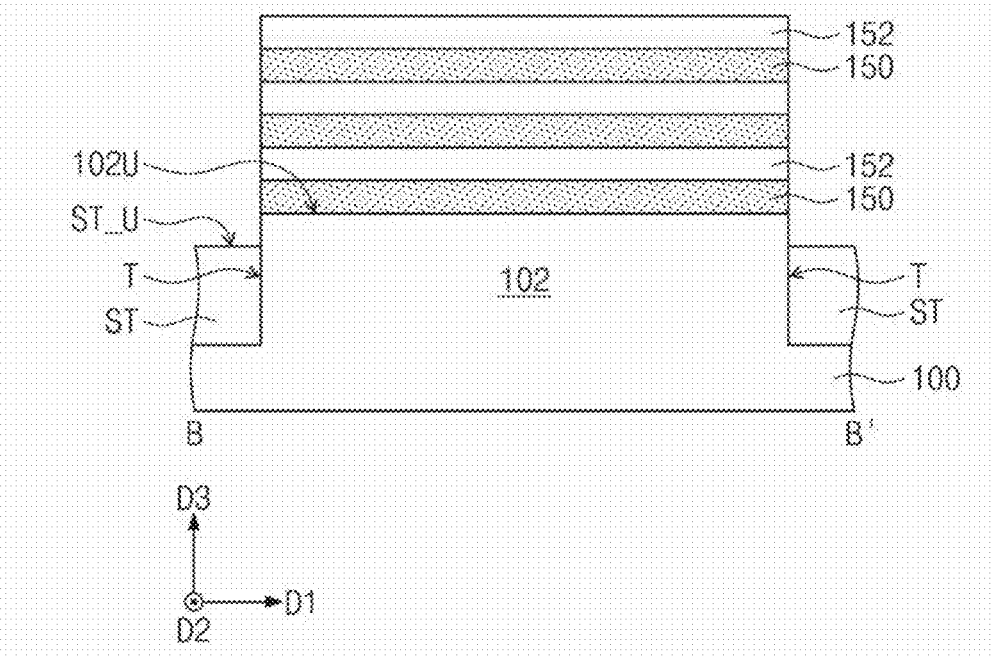
Figure 4A:
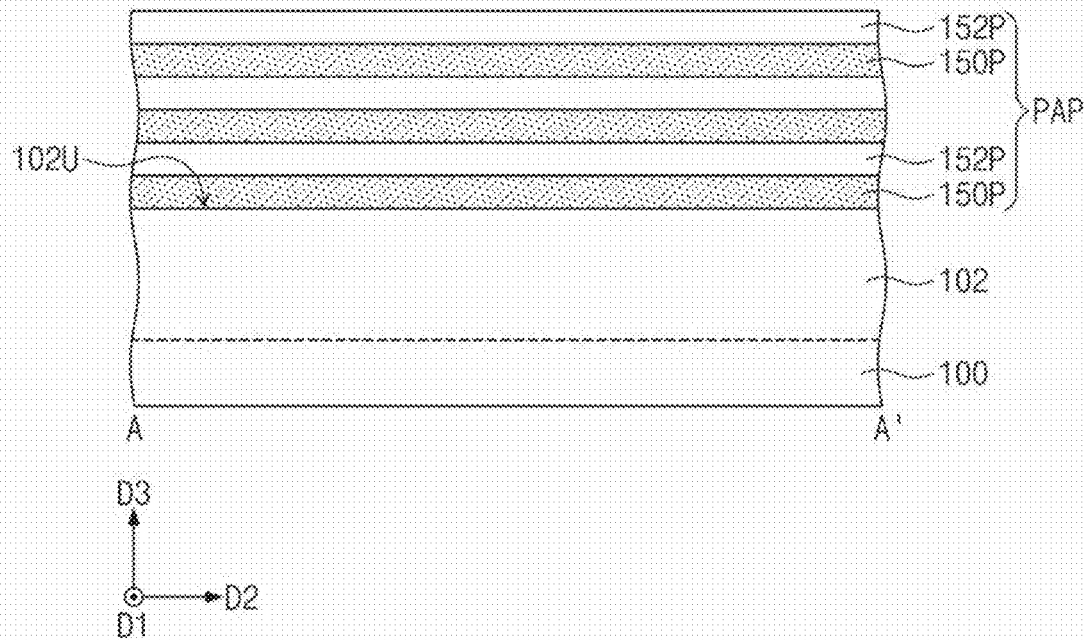
Figure 4B:
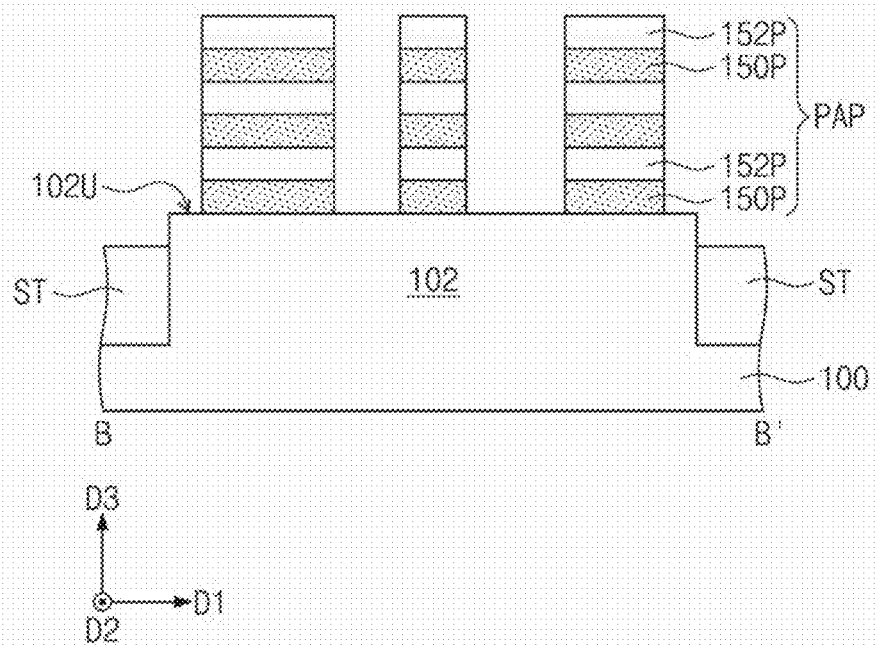
Figure 5A:
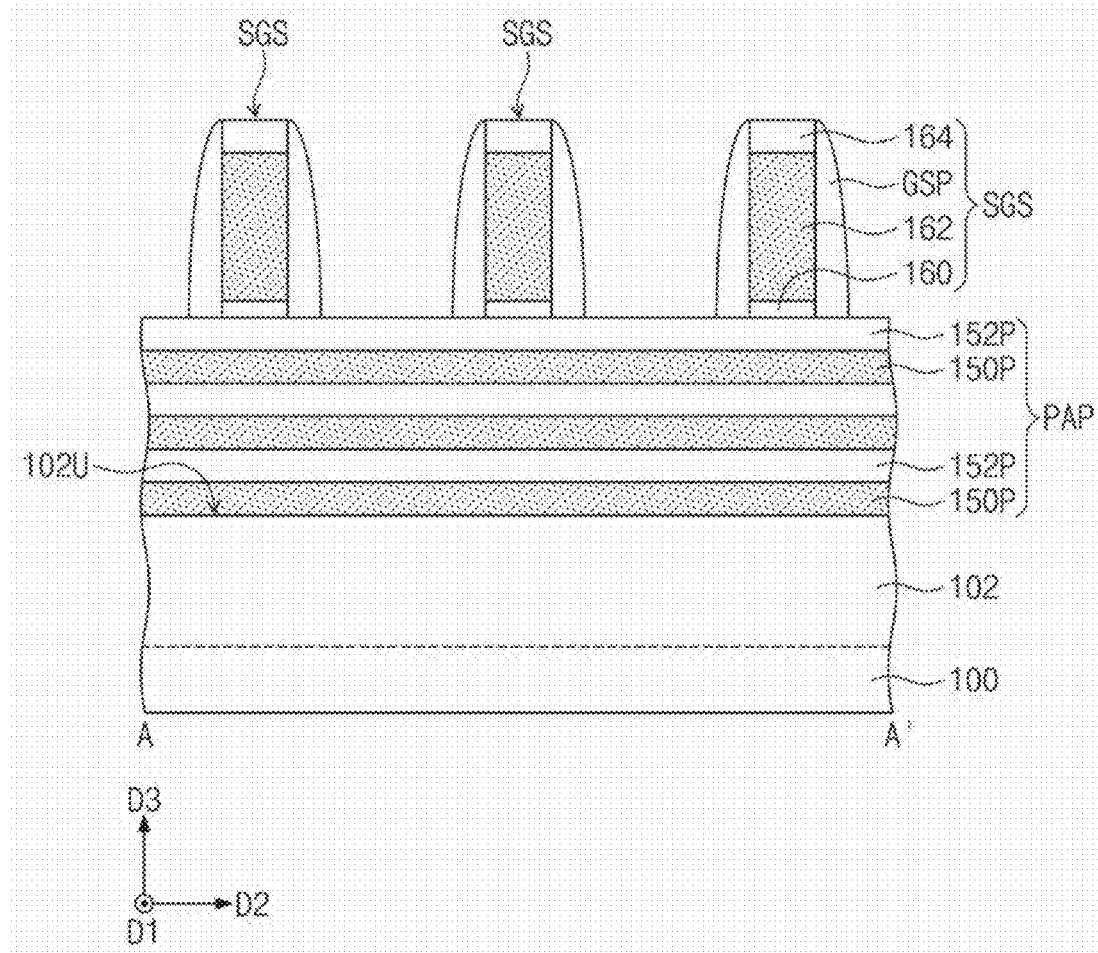
Figure 5B:
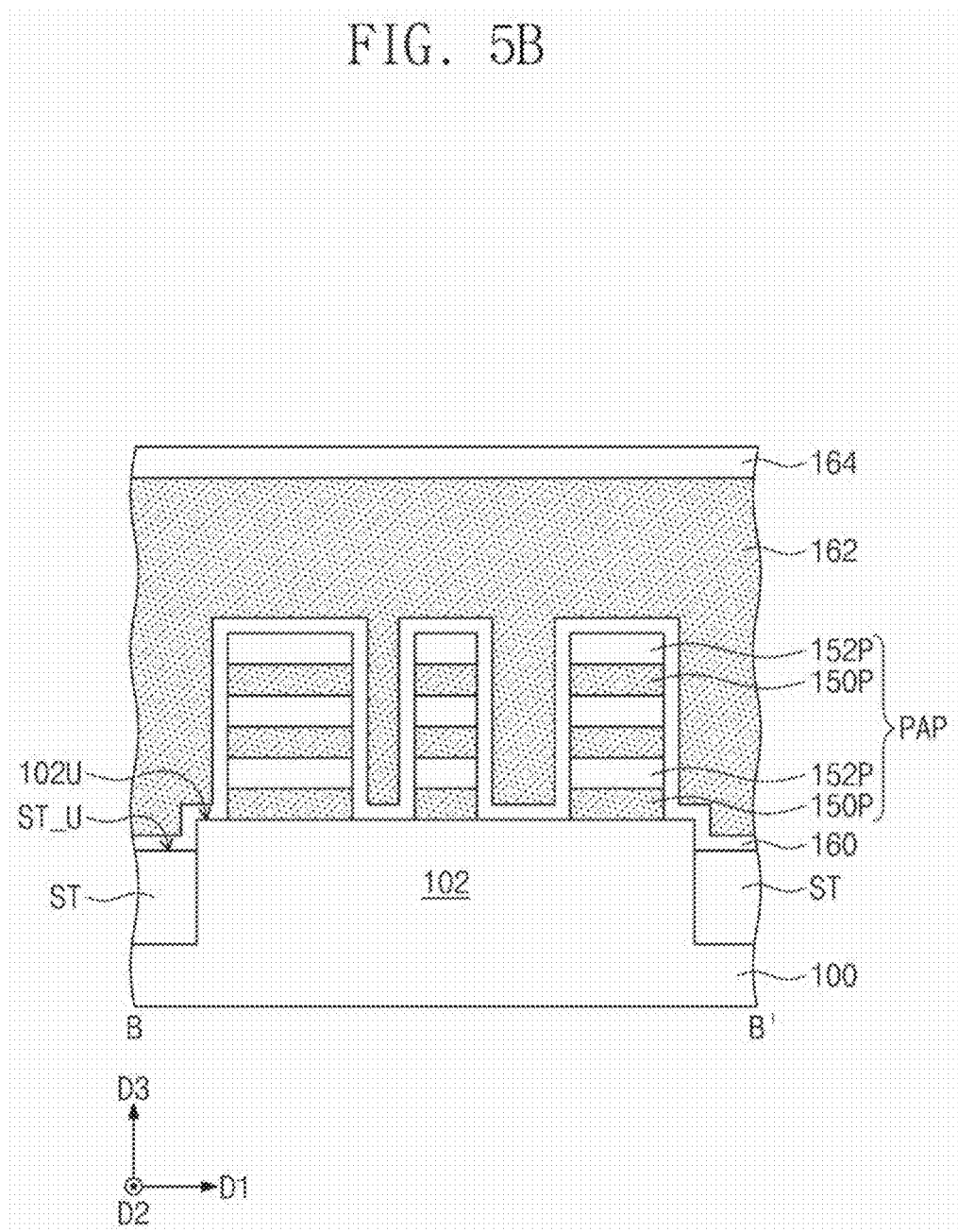
Figure 5C:
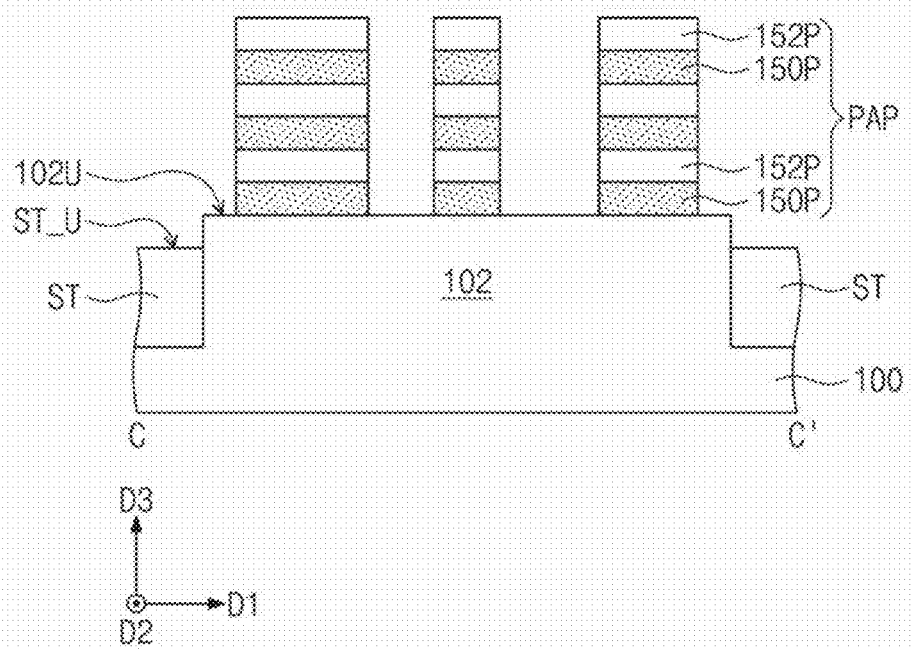
Figure 6A:
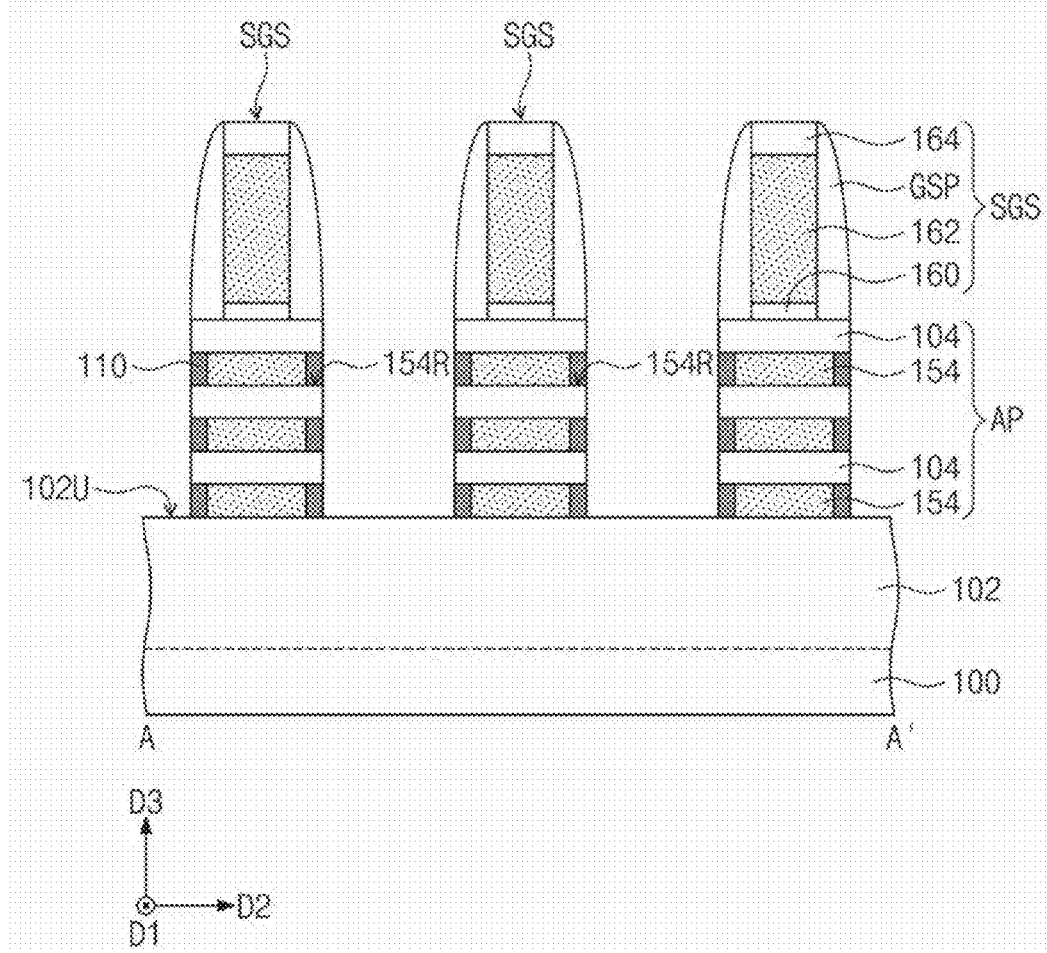
Figure 6B:
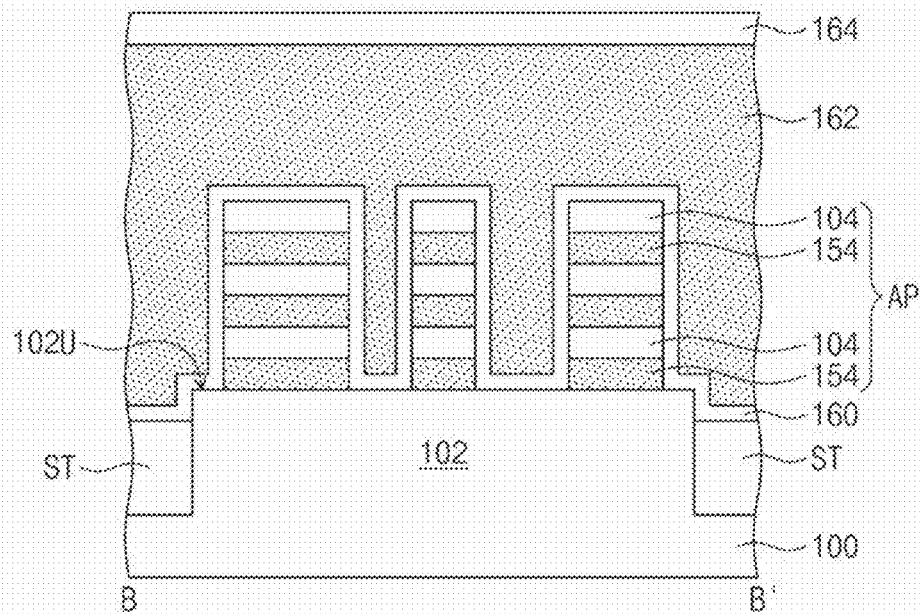
Figure 6C:
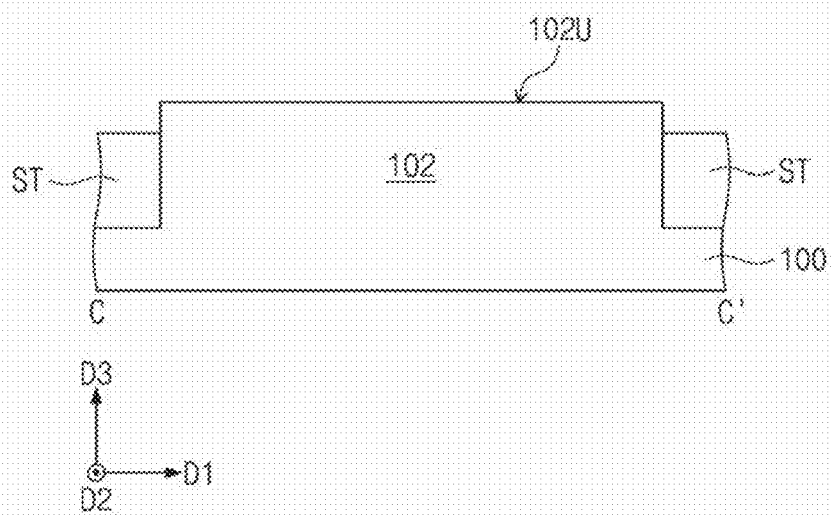
Figure 7A:
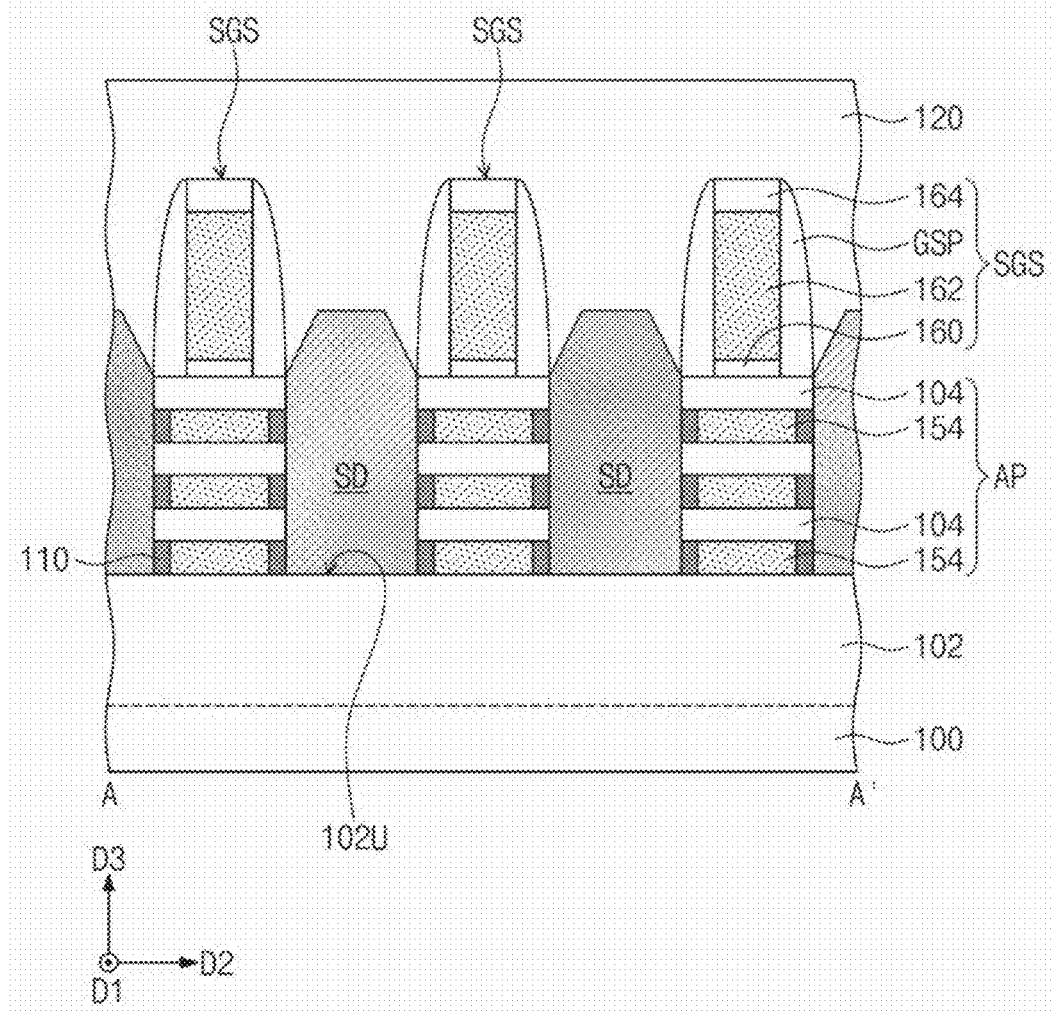
Figure 7C:
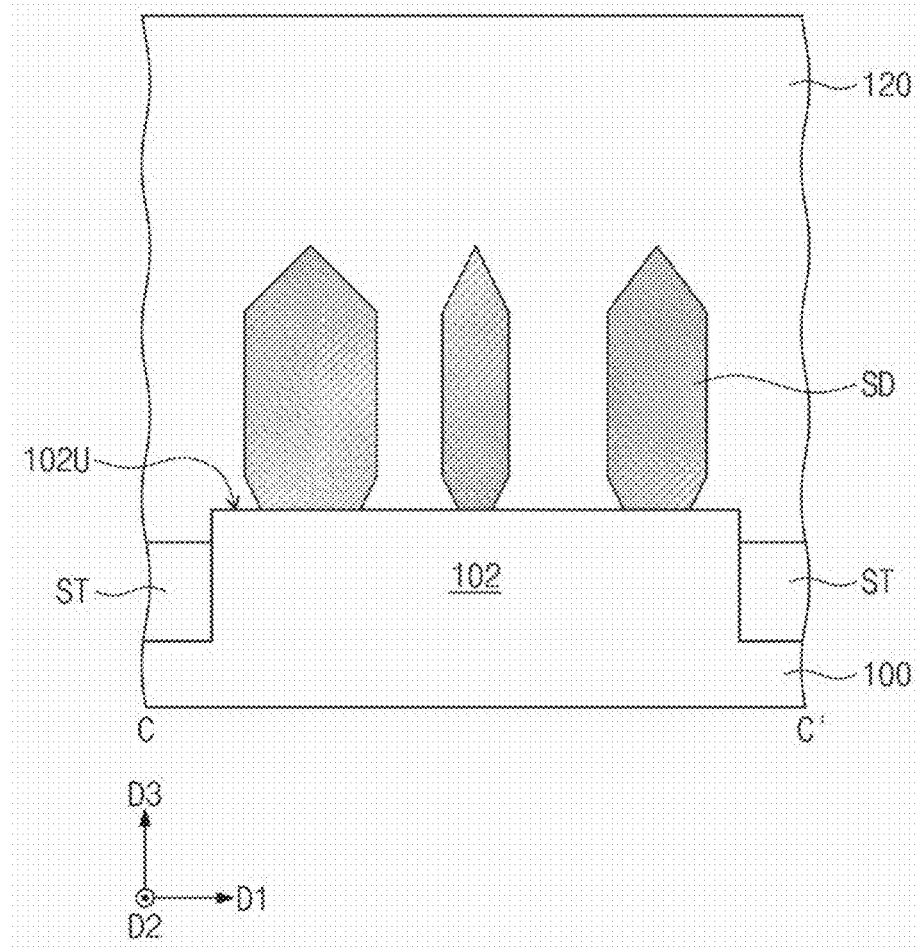
Figure 8A:
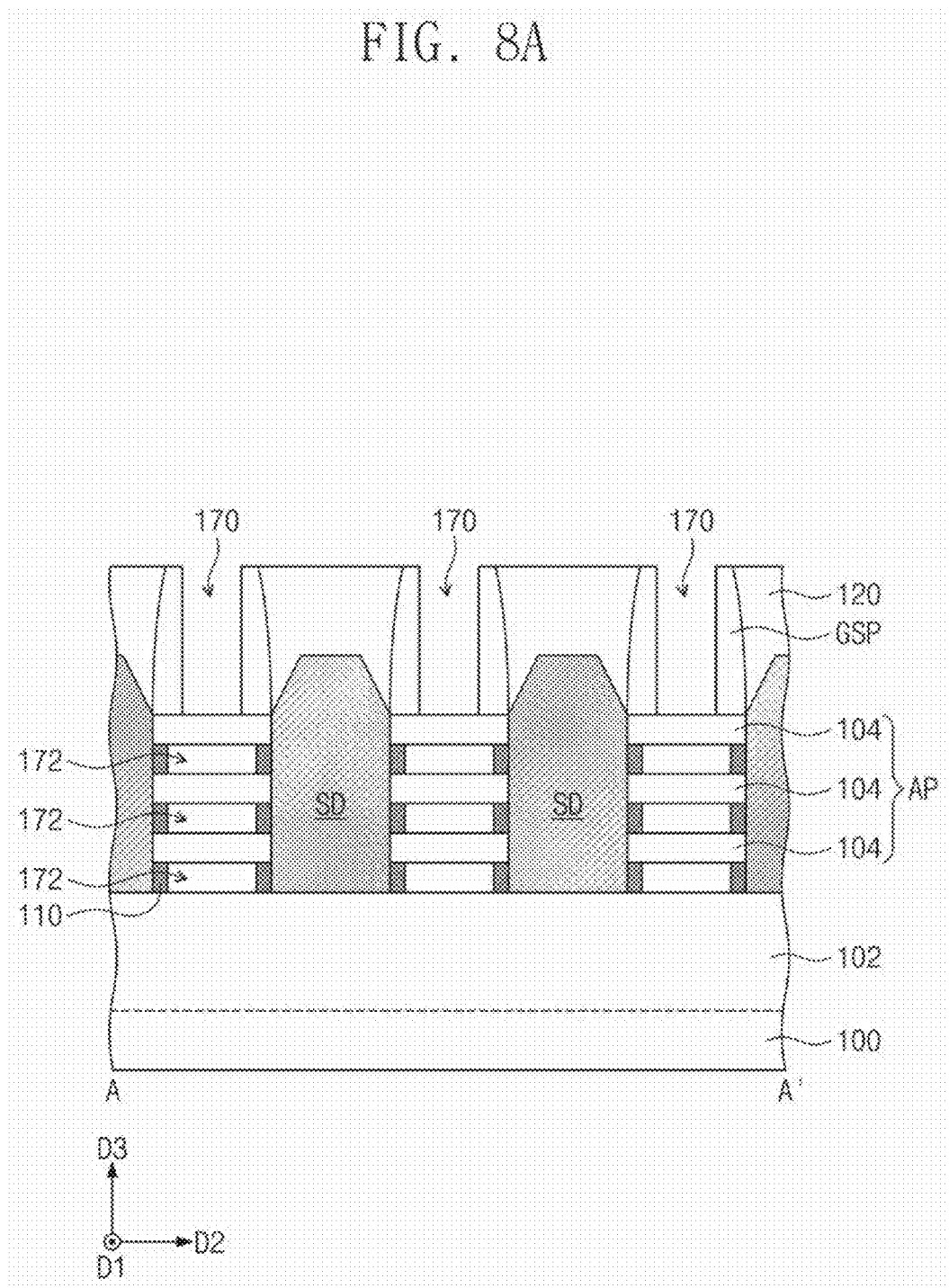
Figure 8B:
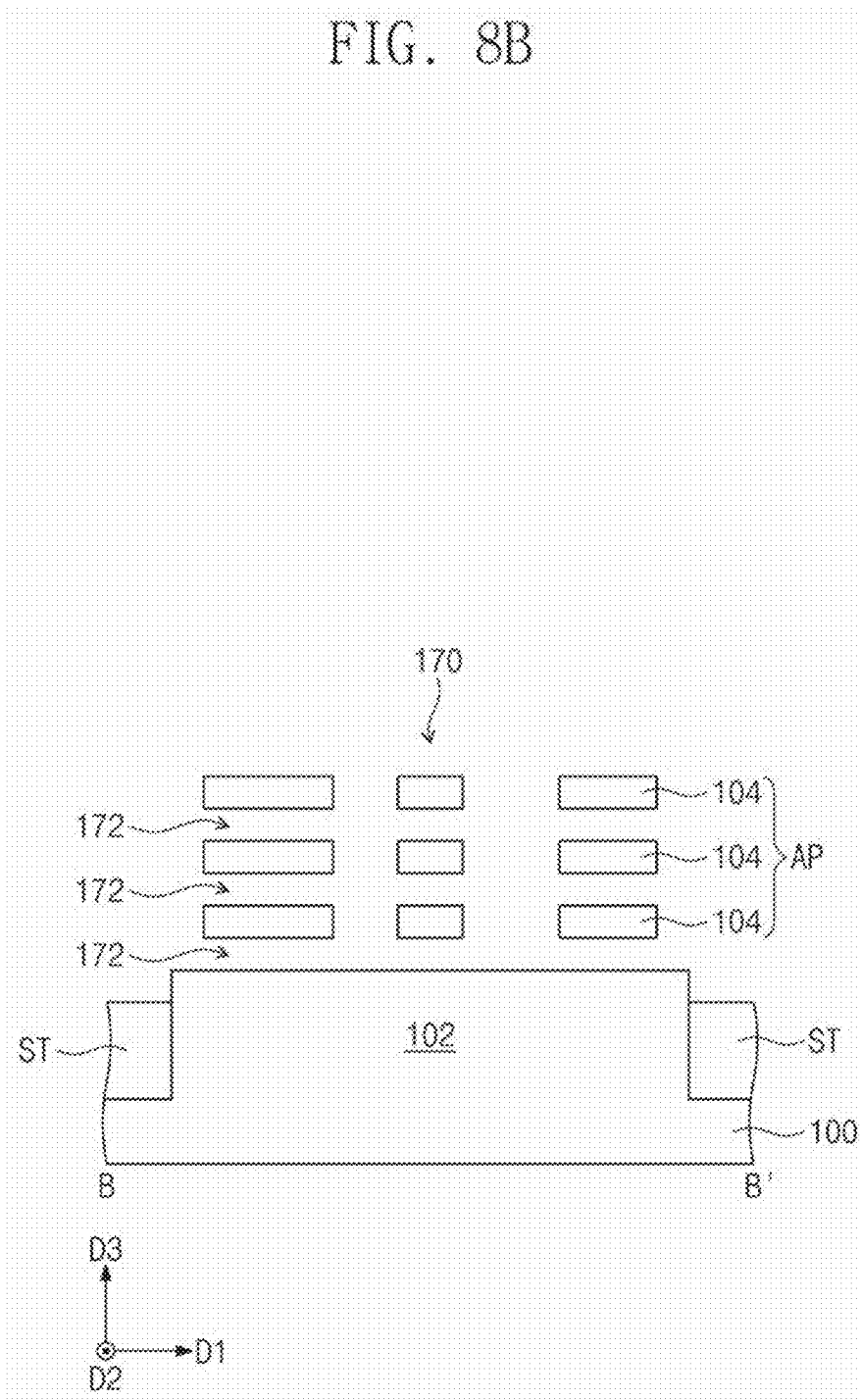
Figure 8C:
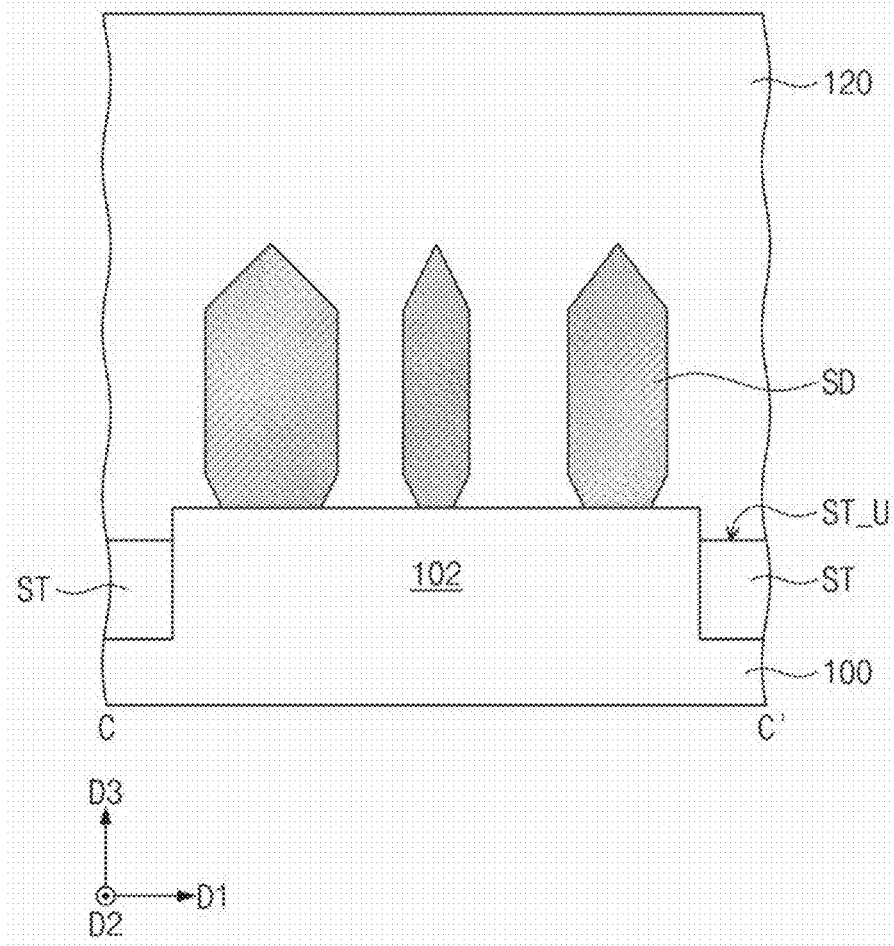
Figure 9A:
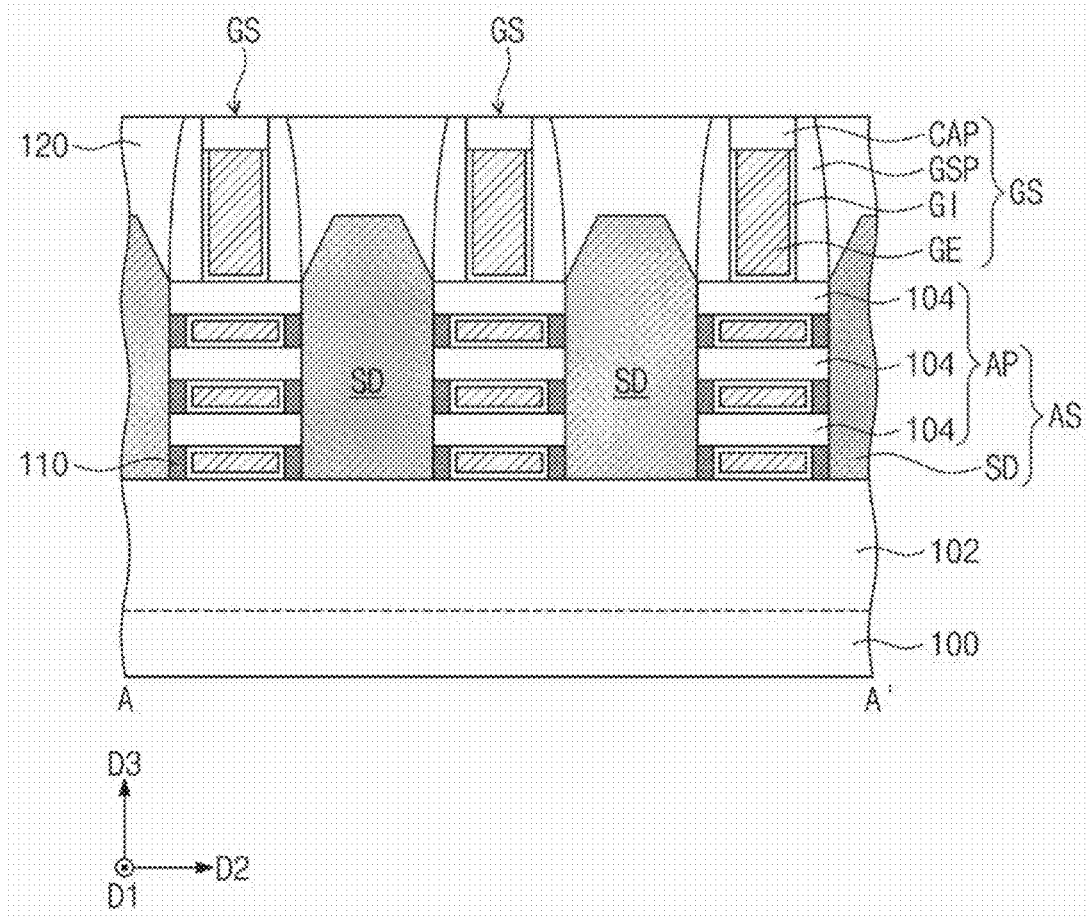
Figure 9B:
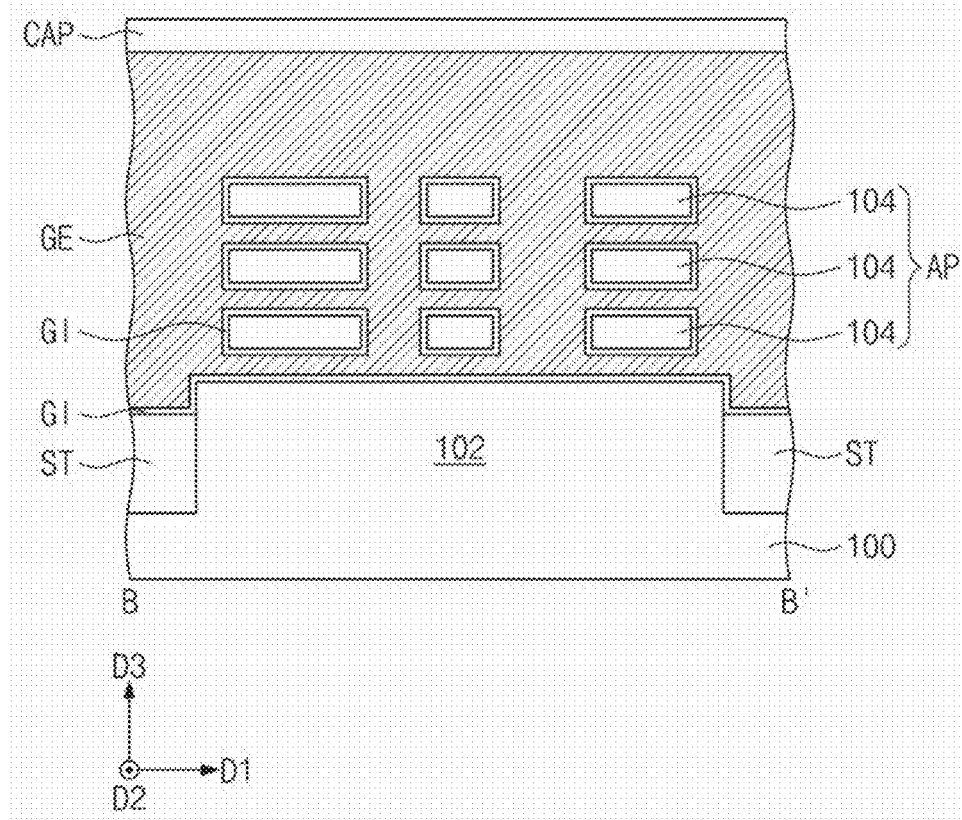

FIG. 1 illustrates a plan view showing a semiconductor device according to some example embodiments of inventive concepts. FIGS. 2A, 2B, and 2C illustrate cross-sectional views respectively taken along lines A-A', B-B', and C-C' of FIG. 1.

Referring to FIGS. 1, 2A, 2B and 2C, an active region 102 may be disposed on a substrate 100. The substrate 100 may include, e.g. may be, a semiconductor substrate. For example, the substrate 100 may be or include a silicon substrate or a silicon-on-insulator (SOI) substrate. The active region 102 may protrude upwardly from the substrate 100. The active region 102 may extend along a first direction D1 and a second direction D2 that are parallel to a bottom surface 100B of the substrate 100, and may protrude from the substrate 100 along a third direction D3 perpendicular to the bottom surface 100B of the substrate 100. The first direction D1 and the second direction D2 may intersect each other. The first direction D1 and the second direction D2 may be perpendicular to each other.

Device isolation patterns ST may be disposed on the substrate 100, defining the active region 102. The device isolation patterns ST may be disposed on the substrate 100 on opposite sides of the active region 102. For example, the device isolation patterns ST may be spaced apart from each other in the first direction D1 across the active region 102, while extending in the second direction D2. The active region 102 may be a single active region between the device isolation patterns ST. The device isolation patterns ST may include one or more of oxide, nitride, or oxynitride. The device isolation patterns ST may be formed with an oxidation process such as in-situ steam generation (ISSG); however, inventive concepts are not limited thereto. In certain example embodiments, the device isolation patterns ST may expose upper lateral surfaces of the active region 102. For example, the device isolation patterns ST may have their top surfaces ST_U at a lower level than that of a top surface 102U of the active region 102. In descriptions of example embodiments, the term "level" indicates a height measured from the bottom surface 100B of the substrate 100.

A plurality of channel patterns AP may be disposed on the active region 102. The channel patterns AP may be spaced apart from each other in the first direction D1 on the top surface 102U of the active region 102. Each of the channel patterns AP may include a plurality of semiconductor patterns 104 that are stacked along a direction (e.g., the third direction D3) perpendicular to the top surface 102U of the active region 102. The semiconductor patterns 104 may be spaced apart from each other along the direction (e.g., the third direction D3) perpendicular to the top surface 102U of the active region 102. A lowermost one of the semiconductor patterns 104 may be spaced apart from the top surface 102U of the active region 102 along the direction (e.g., the third direction D3) perpendicular to the top surface 102U of the active region 102. Although three semiconductor patterns 104 are illustrated, inventive concepts are not limited thereto, and the number of semiconductor patterns 104 may be two, or may be four or more, such as five, six, or seven. The semiconductor patterns 104 may include one or more of silicon (Si), germanium (Ge), or silicon-germanium (SiGe).

The active region 102 and the channel patterns AP may each have a width along the first direction D1. The channel patterns AP may have their widths W1, W2, and W3 that are the same as widths of the semiconductor patterns 104 included in each of the channel patterns AP. The active region 102 may have a width 102W greater than a sum of the widths W1, W2, and W3 of the channel patterns AP (e.g., 102W>(W1+W2+W3)). The width 102W of the active region 102 may be the same as or greater than a sum of the widths W1, W2, and W3 of the channel patterns AP and distances d1 and d2 between the channel patterns AP (e.g., 102W>(W1+W2+W3+d1+d2)). Each of the distances d1 and d2 between the channel patterns AP may be a distance in the first direction D1 between a pair of adjacent ones of the channel patterns AP. The width 102W of the active region 102 may be a width at the top of the active region 102. In some example embodiments, the width W1 of at least one of the channel patterns AP may be different from one or both of the widths W2 and W3 of other channel patterns AP. In some example embodiments, the widths W1, W2, and W3 of the channel patterns AP may be different from each other, but in some example embodiments, may be the same as each other.

In some example embodiments, the distance d1 between at least a pair of channel patterns AP may be different from the distance d2 between another pair of the channel patterns AP. In some example embodiments, the distances d1 and d2 between the channel patterns AP may be the same as each other.

The channel patterns AP may include, for example, a first sub-channel pattern APa, a second sub-channel pattern APb, and a third sub-channel pattern APc, each of which are spaced apart from each other in the first direction D1 on the active region 102. In some example embodiments, the first, second, and third sub-channel patterns APa, APb, and APc may have their respective widths W1, W2, and W3 that are different from each other. In some example embodiments, two of three widths W1, W2, W3 may be the same, and the third of the widths W1, W2, W3 may be different. The distance d1 between the first sub-channel pattern APa and the second sub-channel pattern APb may be different from the distance d2 between the second sub-channel pattern APb and the third sub-channel pattern APc. A plurality of source/drain patterns SD may be disposed on the active region 102, and may be arranged along the first direction D1 and the second direction D2 on the top surface 102U of the active region 102. The source/drain patterns SD may include source pattern SDa and drain patterns SDb. The source patterns SDa may be arranged along the first direction D1, and may be correspondingly connected to lateral surfaces of the channel patterns AP. The drain patterns SDb may be spaced apart in the second direction D2 from the source patterns SDa. The drain patterns SDb may be arranged along the first direction D1, and may be correspondingly connected to other lateral surfaces of the channel patterns AP.

Each of the source/drain patterns SD may have a width along the first direction D1. The width 102W of the active region 102 may be greater than a sum of widths W1a, W2a, and W3a of the source patterns SDa (e.g., 102W>(W1a+W2a+W3a)). In some example embodiments, the width W1a of at least one of the source patterns SDa may be different from one or both of the widths W2a and W3a of other source patterns SDa. In some example embodiments, the widths W1a, W2a, and W3a of the source patterns SDa may be different from each other, but in other example embodiments, may be the same as each other. Each of the drain patterns SDb may have a width substantially the same as that of a corresponding one of the source patterns SDa.

Each of the channel patterns AP may be interposed between a corresponding one of the source patterns SDa and a corresponding one of the drain patterns SDb, and may be connected to the corresponding source pattern SDa and the corresponding drain pattern SDb. The semiconductor patterns 104 of each of the channel patterns AP may be interposed between and in contact with the corresponding source pattern SDa and the corresponding drain pattern SDb. The semiconductor patterns 104 of each of the channel patterns AP may connect the corresponding source pattern SDa to the corresponding drain pattern SDb. An active structure AS may be constituted by, or be included in, each of the channel patterns AP, the respective corresponding source pattern SDa, and the respective corresponding drain pattern SDb. Therefore, a plurality of active structures AS may be disposed to be spaced apart from each other in the first direction D1 on the top surface 102U of the active region 102.

The source/drain patterns SD may be or include epitaxial patterns, e.g. homogenous epitaxial patterns or heterogeneous epitaxial patterns, formed from seed layers including the active region 102 and the semiconductor patterns 104 of each of the channel patterns AP. The source/drain patterns SD may include one or more single-crystal semiconductor elements. The source/drain patterns SD may include one or more of silicon-germanium (SiGe), silicon (Si), or silicon carbide (SiC). In some embodiments, the source/drain patterns SD may be configured to provide the channel patterns AP with tensile strains. For example, when the semiconductor patterns 104 include silicon (Si) such as single-crystal silicon, the source/drain patterns SD may include silicon (Si) and/or silicon carbide (SiC). Alternatively, in some example embodiments, the source/drain patterns SD may be configured to provide the channel patterns AP with compressive strains. For example, when the semiconductor patterns 104 include silicon (Si) such as single-crystal silicon, the source/drain patterns SD may include silicon-germanium (SiGe). The compressive/tensile strain from carbon or germanium may improve either or both of electron or hole mobility. The source/drain patterns SD may further include impurities, such as but not limited to be at least one of boron, phosphorus, or arsenic. The impurities may be adopted to improve electrical characteristics of a transistor that includes the source/drain patterns SD. When the transistor corresponds to, e.g. is, an NMOSFET, the impurities may be or include, for example, phosphorus (P) and/or arsenic (As). When the transistor corresponds to, e.g. is, a PMOSFET, the impurities may be or include, for example, boron (B). Other impurities, for example other group III and/or group V impurities, may be included in the source/drain patterns SD; however, example embodiments are not limited thereto.

A plurality of gate structure GS may be disposed on the active region 102, and may extend in the first direction D1 to run across the plurality of active structures AS and the device isolation patterns ST. When viewed in plan, the channel patterns AP may overlap the gate structure GS, and the source/drain patterns SD may be disposed on opposite sides of the gate structure GS. For example, a pattern corresponding to a source of a transistor may be on one side of the gate structure GS, and a pattern corresponding to a drain of the transistor may on an opposite side of the gate structure GS.

The gate structure GS may include a gate electrode GE that extends in the first direction D1 and covers the plurality of channel patterns AP, a gate dielectric pattern GI between the gate electrode GE and each of the channel patterns AP, gate spacers GSP on lateral surfaces of the gate electrode GE, and a gate capping pattern CAP on a top surface of the gate electrode GE. The gate dielectric pattern GI may extend between the gate electrode GE and the gate spacers GSP, and may have an uppermost top surface substantially coplanar with the top surface of the gate electrode GE. The gate electrode GE may cover an uppermost top surface and lateral surfaces of each of the channel patterns AP, with lateral surfaces facing each other in the first direction D1. The gate electrode GE may cover the top surface 102U of the active region 102 between the channel patterns AP, and may extend in the first direction D1 to cover the top surfaces ST_U of the device isolation patterns ST. The gate electrode GE may fill a space between the active region 102 and each of the channel patterns AP and a space between the semiconductor patterns 104. The gate dielectric pattern GI may be interposed between the gate electrode GE and each of the semiconductor patterns 104. Each of the semiconductor patterns 104 may be spaced apart from the gate electrode GE across the gate dielectric pattern GI. The gate dielectric pattern GI may extend along a bottom surface of the gate electrode GE, and may be interposed between the gate electrode GE and the active region 102 and between the gate electrode GE and each of the device isolation patterns ST. The gate electrode GE and each of the active structures AS may constitute, or be included in, a gate-all-around type field effect transistor.

The gate electrode GE may include one or more of semiconductor such as a doped semiconductor, conductive metal nitride, or metal. The doped semiconductor may include doped polysilicon. The gate dielectric pattern GI may include one or more of a silicon oxide layer, a silicon nitride layer, a silicon oxynitride layer, or a high-k dielectric layer. The high-k dielectric layer may include a material, such as hafnium oxide (HfM), aluminum oxide (AlO), and/or tantalum oxide (TaO), whose dielectric constant is greater than that of a silicon oxide layer. The gate spacers GSP and the gate capping pattern CAP may each include one or more of a silicon oxide layer, a silicon nitride layer, or a silicon oxynitride layer. The gate spacers GSP and the gate capping pattern CAP may include the same, or different, material.

Spacer patterns 110 may be disposed between the gate electrode GE and each of the source/drain patterns SD. The spacer patterns 110 may be spaced apart from each other in the third direction D3. The spacer patterns 110 and the semiconductor patterns 104 may be stacked alternately and repeatedly along the third direction D3. Each of the spacer patterns 110 may be disposed between adjacent semiconductor patterns 104 or between the active region 102 and the lowermost semiconductor pattern 104. A pair of spacer patterns 110 may be disposed between a pair of adjacent ones of the semiconductor patterns 104. The pair of spacer patterns 110 may be spaced apart from each other in the second direction D2 across the gate electrode GE. The pair of spacer patterns 110 may be disposed between a pair of corresponding source/drain patterns SD.

Each of the source/drain patterns SD may be in contact with the semiconductor patterns 104, and may be spaced apart from the gate electrode GE across the spacer pattern 110. The gate dielectric pattern GI may be interposed between the gate electrode GE and each of the semiconductor patterns 104, and may extend between the gate electrode GE and each of the spacer patterns 110. Each of the spacer patterns 110 may be in contact with the gate dielectric pattern GI. The spacer patterns 110 may include silicon nitride. For example, the spacer patterns 110 may include at least one of SiN, SiCN, SiOCN, SiBCN, or SiBN.

The substrate 100 may be provided thereon with a lower interlayer dielectric layer 120 that covers the gate structure GS and the source/drain patterns SD. The lower interlayer dielectric layer 120 may include at least one of a silicon oxide layer, a silicon nitride layer, a silicon oxynitride layer, or a low-k dielectric layer. The gate capping pattern CAP may have a top surface substantially coplanar with that of the lower interlayer dielectric layer 120. The gate spacer GSP may be interposed between the gate capping pattern CAP and the lower interlayer dielectric layer 120.

An upper interlayer dielectric layer 130 may be disposed on the lower interlayer dielectric layer 120. The upper interlayer dielectric layer 130 may include at least one of an oxide layer, a nitride layer, or an oxynitride layer. Contact plugs CT may penetrate the upper and lower interlayer dielectric layers 130 and 120 and have electrical connection with the source/drain patterns SD. The contact plugs CT may be disposed on opposite sides of the gate structure GS. The source patterns SDa of the source/drain patterns SD may be connected to each other by one of the contact plugs CT. The drain patterns SDb of the source/drain patterns SD may be connected to each other by another of the contact plugs CT. Although not shown, a gate contact plug may penetrate the upper interlayer dielectric layer 130 and have electrical connection with the gate electrode GE. The upper interlayer dielectric layer 130 may be provided thereon with connection lines that are coupled to the contact plugs CT and the gate contact plug. The contact plugs CT and the gate contact plug may include conductive metal nitride and/or metal. For example, the contact plugs CT and the gate contact plug may include metal nitride, such as at least one of TiN, WN, and TaN, and/or metal, such as at least one of Ti, W, and Ta. The connection lines may include a conductive material.

According to inventive concepts, the plurality of channel patterns AP may be disposed to be spaced apart from each other in the first direction D1 on the single active region 102, and the plurality of source/drain patterns SD may be disposed on the single active region 102 on opposite sides of the channel patterns AP. Because the channel patterns AP are disposed spaced apart from each other in the first direction D1 on the single active region 102, the formation of the channel patterns AP may be easy and/or with reduced complexity, as discussed below. Further, the widths W1, W2, and W3 of the channel patterns AP and the widths W1a, W2a, and W3a of the source/drain patterns SD may be variously adjusted to increase the degree of freedom for designing a semiconductor integrated circuit that includes a transistor achieved by the channel patterns AP, the source/drain patterns SD, and the gate structure GS. For example a degree of freedom associated with a threshold voltage and/or a drive current of the transistor may be improved. Such an improvement may enable improved flexibility in the design of integrated circuits.

FIGS. 3A to 9A, 3B to 9B, and 3C to 9C illustrate cross-sectional views respectively taken along lines A-A', B-B', and C-C' of FIG. 1, showing a method of fabricating a semiconductor device according to some example embodiments of inventive concepts. For brevity of description, omission will be made to avoid duplicate explanation of the semiconductor device discussed with reference to FIGS. 1 and 2A to 2C.

Referring to FIGS. 1 and 3A to 3C, sacrificial layers 150 and semiconductor layers 152 may be stacked alternately and repeatedly on a substrate 100. The sacrificial layers 150 and the semiconductor layers 152 are each illustrated repeatedly stacked three times, but inventive concepts are not limited thereto. The sacrificial layers 150 may include a material having an etch selectivity, e.g. a wet etch selectivity, with respect to the semiconductor layers 152. For example, the sacrificial layers 150 may include one of SiGe, Si, or Ge, and the semiconductor layers 152 may include another of SiGe, Si, and Ge. The sacrificial layers 150 and the semiconductor layers 152 may be formed by performing an epitaxial growth process in which the substrate 100 is used as a seed. The sacrificial layers 150 and the semiconductor layers 152 may be formed to have the same thickness as each other or different thicknesses from each other.

An active region 102 may be formed on the substrate 100. The sacrificial layers 150 and the semiconductor layers 152 may be formed on the active region 102 with an epitaxial chemical vapor deposition (CVD) process, either at the same time, or alternatively, at different times. The epitaxial CVD process may be homogenous and/or heterogeneous; however, example embodiments are not limited thereto. For example, in a case wherein the substrate 100 and the active region 102 is formed of Si, the sacrificial layer 150 is formed of SiGe, and the semiconductor layer 152 is formed of Si, the epitaxial CVD process may be performed within one epitaxial process, initially homogenously depositing the active region 102 on the substrate, then repeatedly and heterogeneously depositing the sacrificial layer 150 and the semiconductor layer 152. The formation of the active region 102 may further include that the sacrificial layers 150, the semiconductor layers 152, and an upper portion of the substrate 100 are sequentially patterned to form in the substrate 100 trenches T that define the active region 102. The trenches T may be spaced apart from each other in a first direction D1, and may have a linear shape that extends in a second direction D2. Device isolation patterns ST may be formed to fill, or partially fill, corresponding trenches T. The device isolation patterns ST may be formed on the substrate 100 on opposite sides of the active region 102. The device isolation patterns ST may extend in the second direction D2, and may be spaced apart from each other in the first direction D1 across the active region 102. The formation of the device isolation patterns ST may include forming on the substrate 100 a dielectric layer that fills the trenches T, and recessing the dielectric layer so as to expose lateral surfaces of the sacrificial layers 150 and lateral surfaces of the semiconductor layers 152. The recessing of the dielectric layer may cause the device isolation patterns ST to have their top surfaces ST_U at a lower level than that of a top surface 102U of the active region 102. A process of formation of the device isolation patterns ST may include at least one of a plasma-enhanced CVD (PECVD) process, a low-pressure CVD (LPCVD) process, an atomic layer deposition (ALD) process, or a spin-on glass (SOG) process; however, example embodiments are not limited thereto.

Referring to FIGS. 1 and 4A to 4C, a plurality of preliminary channel patterns PAP may be formed on the top surface 102U of the active region 102. The sacrificial layers 150 and the semiconductor layers 152 may be sequentially patterned to form the preliminary channel patterns PAP. The formation of the preliminary channel patterns PAP may include a photolithographic process, such as but not limited to be an immersion photolithographic process and/or an extreme ultra-violate (EUV) process. The preliminary channel patterns PAP may be spaced apart from each other in the first direction D1 on the top surface 102U of the active region 102, and may have a linear shape that extends in the second direction D2. Each of the preliminary channel patterns PAP may include preliminary sacrificial patterns 150P and preliminary semiconductor patterns 152P that are formed by patterning the sacrificial layers 150 and the semiconductor layers 152, respectively. The preliminary sacrificial patterns 150P and the preliminary semiconductor patterns 152P may be stacked alternately and repeatedly along the third direction D3. The preliminary sacrificial patterns 150P and the preliminary semiconductor patterns 152P may each have a linear shape that extends in the second direction D2 on the top surface 102U of the active region 102.

Each of the preliminary channel patterns PAP may have a width along the first direction D1. In some example embodiments, the width of at least one of the preliminary channel patterns PAP may be different from the width of another of the preliminary channel patterns PAP. In some example embodiments, the widths of the preliminary channel patterns PAP may be different from each other, but in other embodiments, may be the same as each other. In some example embodiments, a distance between at least a pair of preliminary channel patterns PAP may be different from that between another pair of preliminary channel patterns PAP. In some example embodiments, distances between the preliminary channel patterns PAP may be the same as each other. Each of the distances between the preliminary channel patterns PAP may be a distance in the first direction D1 between a pair of adjacent ones of the preliminary channel patterns PAP.

Referring to FIGS. 1 and 5A to 5C, a sacrificial gate structure SGS may be formed to run across the plurality of preliminary channel patterns PAP. The sacrificial gate structure SGS may extend in the first direction D1, and may run across the active region 102, the plurality of preliminary channel patterns PAP, and the device isolation patterns ST. The sacrificial gate structure SGS may include an etch stop pattern 160, a sacrificial gate pattern 162, and a mask pattern 164 that are sequentially stacked on the substrate 100. The sacrificial gate pattern 162 may have a linear shape that extends in the first direction D1. The sacrificial gate pattern 162 may cover facing lateral surfaces in the first direction D1 of each of the preliminary channel patterns PAP, a top surface of each of the preliminary channel patterns PAP, the top surface 102U of the active region 102 between the preliminary channel patterns PAP, and the top surfaces ST_U of the device isolation patterns ST. The etch stop pattern 160 may be interposed between the sacrificial gate pattern 162 and each of the preliminary channel patterns PAP, and may extend between the sacrificial gate pattern 162 and the active region 102 and between the sacrificial gate pattern 162 and each of the device isolation patterns ST.

The formation of the sacrificial gate pattern 162 and the etch stop pattern 160 may include sequentially forming on the substrate 100 an etch stop layer (not shown) and a sacrificial gate layer (not shown) that cover the preliminary channel patterns PAP, the active region 102, and the device isolation patterns ST, forming on the sacrificial gate layer the mask pattern 164 that defines a region where the sacrificial gate pattern 162 will be formed, and using the mask pattern 164 as an etching mask to sequentially pattern the sacrificial gate layer and the etch stop layer. The etch stop layer may include, for example, a silicon oxide layer. The formation of the etch stop layer may include, for example, a CVD process and/or an oxidation process; however, inventive concepts are not limited thereto. The sacrificial gate layer may include a material having an etch selectivity, e.g. a wet etch selectivity, with respect to the etch stop layer. The sacrificial gate layer may include, for example, doped or undoped polysilicon. The formation of the sacrificial gate layer may include, for example, a CVD process such as at least one of a PECVD process or an LPCVD process; however, inventive concepts are not limited thereto. The mask pattern 164 may be used as an etching mask to pattern the sacrificial gate layer to form the sacrificial gate pattern 162. The patterning of the sacrificial gate layer may include performing an etching process that has an etch selectivity with respect to the etch stop layer, e.g. a wet etch selectivity with respect to a wet chemical. After the formation of the sacrificial gate pattern 162, the etch stop layer on sides of the sacrificial gate pattern 162 may be removed to locally form the etch stop pattern 160 below the sacrificial gate pattern 162.

The sacrificial gate structure SGS may further include gate spacers GSP on opposite sides of the sacrificial gate pattern 162. The formation of the gate spacers GSP may include forming on the substrate 100 a gate spacer layer (not shown) that covers the mask pattern 164, the sacrificial gate pattern 162, and the etch stop pattern 160, and then anisotropically etching, e.g. etching with a dry etching process, the gate spacer layer. The mask pattern 164 and the gate spacers GSP may include, for example, silicon nitride.

Referring to FIGS. 1 and 6A to 6C, the preliminary channel patterns PAP may be patterned to form a plurality of channel patterns AP below the sacrificial gate structure SGS. The plurality of channel patterns AP may be spaced apart from each other in the first direction D1, and may each overlap the sacrificial gate structure SGS. The formation of the channel patterns AP may include removing portions of each of the preliminary channel patterns PAP at opposite sides of the sacrificial gate structure SGS. The removal of the portions of each of the preliminary channel patterns PAP may include etching the portions of each of the preliminary channel patterns PAP using the mask pattern 164 and the gate spacers GSP as an etching mask. The etching the portions of each of the preliminary channel patterns PAP may include anisotropically etching the preliminary channel patterns PAP with a dry etch process. The etching of the portions of each of the preliminary channel patterns PAP may continue until the top surface 102U of the active region 102 is exposed at opposite sides of the sacrificial gate structure SGS. Each of the channel patterns AP may include sacrificial patterns 154 and semiconductor patterns 104 that are alternately and repeatedly stacked on the active region 102. The sacrificial patterns 154 may be formed by patterning the preliminary sacrificial patterns 150P, and the semiconductor patterns 104 may be formed by patterning the preliminary semiconductor patterns 152P. The sacrificial gate structure SGS may cover lateral surfaces facing each other in the first direction D1 of each of the channel patterns AP, and may expose lateral surfaces facing each other in the second direction D2 of each of the channel patterns AP.

The sacrificial patterns 154 may be horizontally recessed to from recess regions 154R on the lateral surfaces of each of the channel patterns AP, which lateral surfaces are exposed by the sacrificial gate structure SGS. The recess regions 154R may be formed by performing a wet etching process in which the sacrificial patterns 154 are selectively etched. The sacrificial patterns 154 may be horizontally recessed in the second direction D2 as a result of etch selectivity, e.g. wet etch selectivity, between the sacrificial patterns 154 and the semiconductor patterns 104. Afterwards, spacer patterns 110 may be formed in corresponding recess regions 154R. The formation of the spacer patterns 110 may include conformally forming on the substrate 100 a spacer layer that fills the recess regions 154R, and anisotropically etching the spacer layer to locally form the spacer patterns 110 in corresponding recess regions 154R. The spacer patterns 110 may include a low-k dielectric layer (e.g., silicon nitride).

Referring to FIGS. 1 and 7A to 7C, source/drain patterns SD may be formed on the active region 102 on opposite sides of the sacrificial gate structure SGS. The source/drain patterns SD may be formed by performing a selective epitaxial growth process in which the semiconductor patterns 104 and the active region 102 are used as seeds. Each of the source/drain patterns SD may be in contact with lateral surfaces of the semiconductor patterns 104 and the top surface 102U of the active region 102, which lateral surfaces are exposed by the sacrificial gate structure SGS. The source/drain patterns SD may be electrically connected to each other through each of the semiconductor patterns 104. The source/drain patterns SD may be spaced apart from each of the sacrificial patterns 154 across the spacer patterns 110. The source/drain patterns SD may be in contact with the spacer patterns 110.

The source/drain patterns SD may include one or more of silicon-germanium (SiGe), silicon (Si), and silicon carbide (SiC). The formation of the source/drain patterns SD may further include doping impurities into the source/drain patterns SD simultaneously with and/or after the selective epitaxial growth process. The impurities may be adopted to improve electrical characteristics of a transistor that includes the source/drain patterns SD. When the transistor is an NMOSFET, the impurities may be or include, for example, phosphorus (P) and/or arsenic (As) and/or another group V element, but when the transistor is a PMOSFET, the impurities may be or include, for example, boron (B) and/or another group III element. The impurities may be incorporated into the source/drain patterns SD during epitaxial growth and/or implanting, e.g. with a beamline implanter, the impurities into the source/drain patterns. The epitaxial growth for PMOSFET transistors may be performed simultaneously or at different times than the epitaxial growth for NMOSFET transistors.

A lower interlayer dielectric layer 120 may be formed on the substrate 100 upon which the source/drain patterns SD are formed. The lower interlayer dielectric layer 120 may be formed to cover the source/drain patterns SD and the sacrificial gate structure SGS. The lower interlayer dielectric layer 120 may be formed with a CVD process, such as but not limited to be a PECVD process and/or an LPCVD process.

Referring to FIGS. 1 and 8A to 8C, the lower interlayer dielectric layer 120 may be planarized until the sacrificial gate pattern 162 is exposed. The lower interlayer dielectric layer 120 may be planarized with a process such as but not limited to be a chemical-mechanical planarization (CMP) process and/or an etch-back process. The mask pattern 164 may be, e.g. may then be, removed when the lower interlayer dielectric layer 120 is planarized. The sacrificial gate pattern 162 and the etch stop pattern 160 may be removed, and accordingly, a gap region 170 may be formed in the lower interlayer dielectric layer 120. The gap region 170 may be an empty space between the gate spacers GSP. The gap region 170 may expose the plurality of channel patterns AP. The formation of the gap region 170 may include selectively etching the sacrificial gate pattern 162 by performing an etching process that has an etch selectivity, e.g. a wet etch selectivity, with respect to the gate spacer GSP, the lower interlayer dielectric layer 120, and the etch stop pattern 160, and then removing the etch stop pattern 160 to expose the semiconductor patterns 104 and the sacrificial patterns 154. When viewed in plan, the gap region 170 may have a linear shape that extends in the first direction D1, and may expose the top surfaces ST_U of the device isolation patterns ST.

The exposed sacrificial patterns 154 may be selectively removed. For example, when the sacrificial patterns 154 include silicon-germanium (SiGe), and when the semiconductor patterns 104 include silicon (Si), the sacrificial patterns 154 may be selectively removed by performing a wet etching process in which peracetic acid is used as an etching source. During the selective removal process, the source/drain patterns SD may be protected by the lower interlayer dielectric layer 120 and the spacer patterns 110. The selective removal of the sacrificial patterns 154 may form empty regions 172 between the semiconductor patterns 104 and between the active region 102 and a lowermost one of the semiconductor patterns 104. Each of the empty regions 172 may be spatially connected to the gap region 170.

When the single active region 102 is provided thereon with a single channel pattern that is formed to have the same width as that of the single active region 102, removing the sacrificial patterns 154 out of the single channel pattern may be difficult, and thus forming the empty regions 172 to between the semiconductor patterns 104 of the single channel pattern may be difficult.

According to inventive concepts, the plurality of channel patterns AP may be formed spaced apart from each other in the first direction D1 on the single active region 102. Therefore, removing the sacrificial patterns 154 in the plurality of channel patterns AP and forming the empty regions 172 between the semiconductor patterns 104 of each of the plurality of channel patterns AP may be easier. Accordingly, a semiconductor device may more easily be fabricated.

Referring to FIGS. 1 and 9A to 9C, a gate dielectric pattern GI and a gate electrode GE may be formed to fill the gap region 170 and the empty regions 172. The formation of the gate dielectric pattern GI and the gate electrode GE may include forming a gate dielectric layer to conformally cover inner surfaces of the gap region 170 and the empty regions 172, forming a gate conductive layer to fill remaining portions of the gap region 170 and the empty regions 172, and locally forming the gate dielectric pattern GI and the gate electrode GE in the gap region 170 and the empty regions 172 by performing a planarization process, such as a CMP process and/or an etch-back process until the lower interlayer dielectric layer 120 is exposed. The gate dielectric pattern GI may be formed with an oxidation process such as an in-situ steam generation (ISSG) process and/or a CVD process, and the gate electrode GE may be formed with a CVD process. The gate electrode GE may be spaced apart from the active region 102 and each of the semiconductor patterns 104 across the gate dielectric pattern GI, and from each of the source/drain patterns SD across each of the spacer patterns 110.

Upper portions of the gate dielectric pattern GI and the gate electrode GE may be recessed to form a groove region between the gate spacers GSP. A gate capping pattern CAP may be formed in the groove region. The formation of the gate capping pattern CAP may include forming, on the lower interlayer dielectric layer 120, a gate capping layer that fills the groove region, and planarizing the gate capping layer until the lower interlayer dielectric layer 120 is exposed. The planarizing may include a CMP process and/or an etch-back process.

A gate structure GS may be constituted by, or may correspond to or be included in, the gate dielectric pattern GI, the gate electrode GE, the gate capping pattern CAP, and the gate spacers GSP. A pair of source/drain patterns SD may be spaced apart from each other in the second direction D2 across each of the channel patterns AP, and may be in contact with the semiconductor patterns 104 of each of the channel patterns AP. An active structure AS may be constituted by, or may correspond to or be included in, each of the channel patterns AP and the pair of source/drain patterns SD, and a plurality of active structures AS may be disposed spaced apart from each other in the first direction D1 on the active region 102. The gate electrode GE and each of the active structures AS may constitute or correspond to a gate-all-around type field effect transistor.

Referring back to FIGS. 1 and 2A to 2C, an upper interlayer dielectric layer 130 may be formed on the lower interlayer dielectric layer 120. Contact plugs CT may be formed to penetrate the upper and lower interlayer dielectric layers 130 and 120 and to have electrical connection with the source/drain patterns SD, and a gate contact plug (not shown) may be formed to penetrate the upper interlayer dielectric layer 130 and to have electrical connection with the gate electrode GE. The formation of the contact plugs CT and the gate contact plug may include, for example, forming contact holes that penetrate the upper and lower interlayer dielectric layers 130 and 120 and expose the source/drain patterns SD, forming a gate contact hole that penetrates the upper interlayer dielectric layer 130 and exposes the gate electrode GE, forming a conductive layer that fills the contact holes and the gate contact hole, and planarizing the conductive layer until a top surface of the upper interlayer dielectric layer 130 is exposed. The contact plugs CT may include a conductive material such as at least one of doped polysilicon or a metal. Connection lines (not shown) may be formed on the upper interlayer dielectric layer 130 to come into connection with the contact plugs CT and the gate contact plug.

Figure 10:
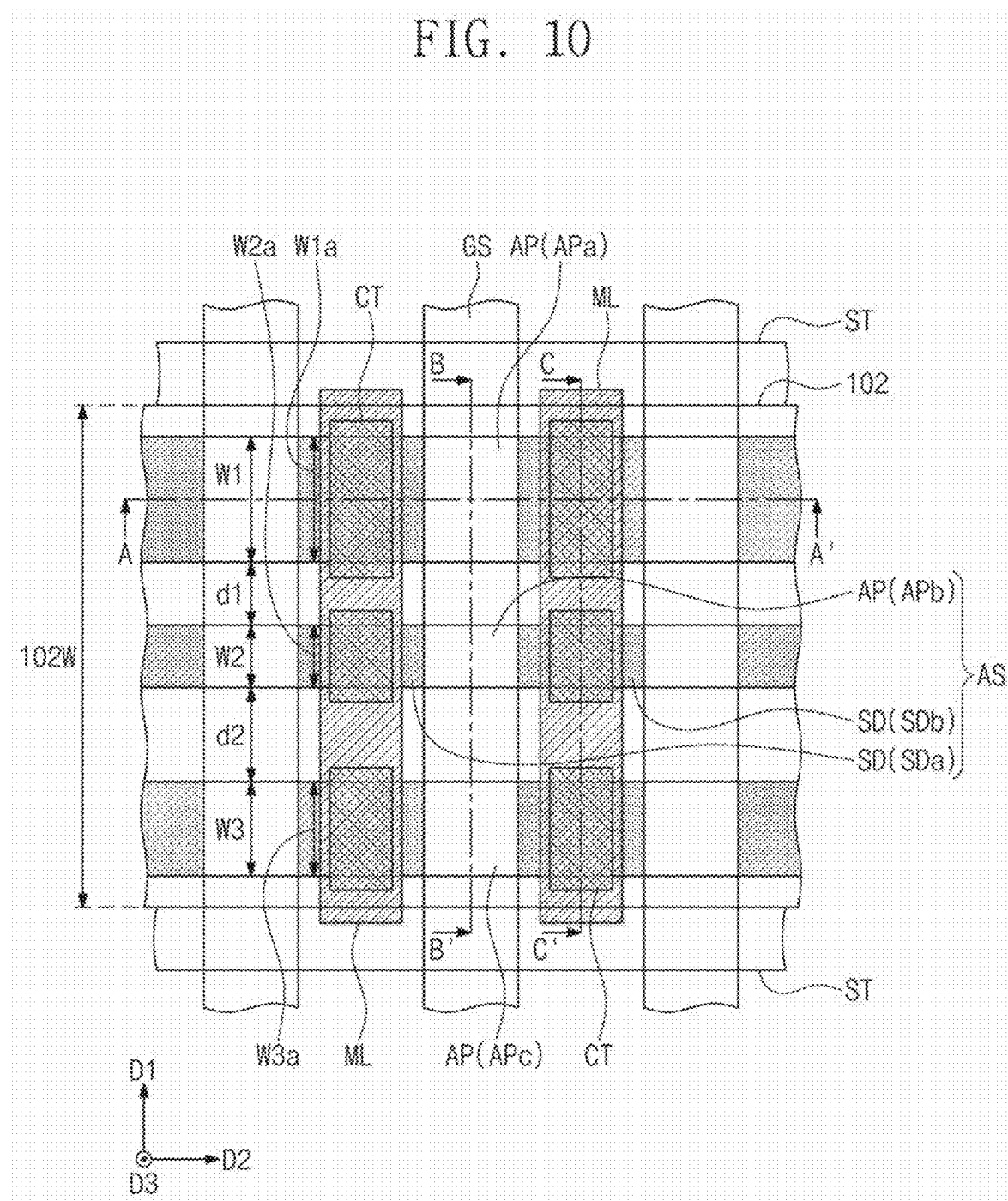
FIG. 10 illustrates a plan view showing a semiconductor device according to some example embodiments of inventive concepts.
Figure 11A:
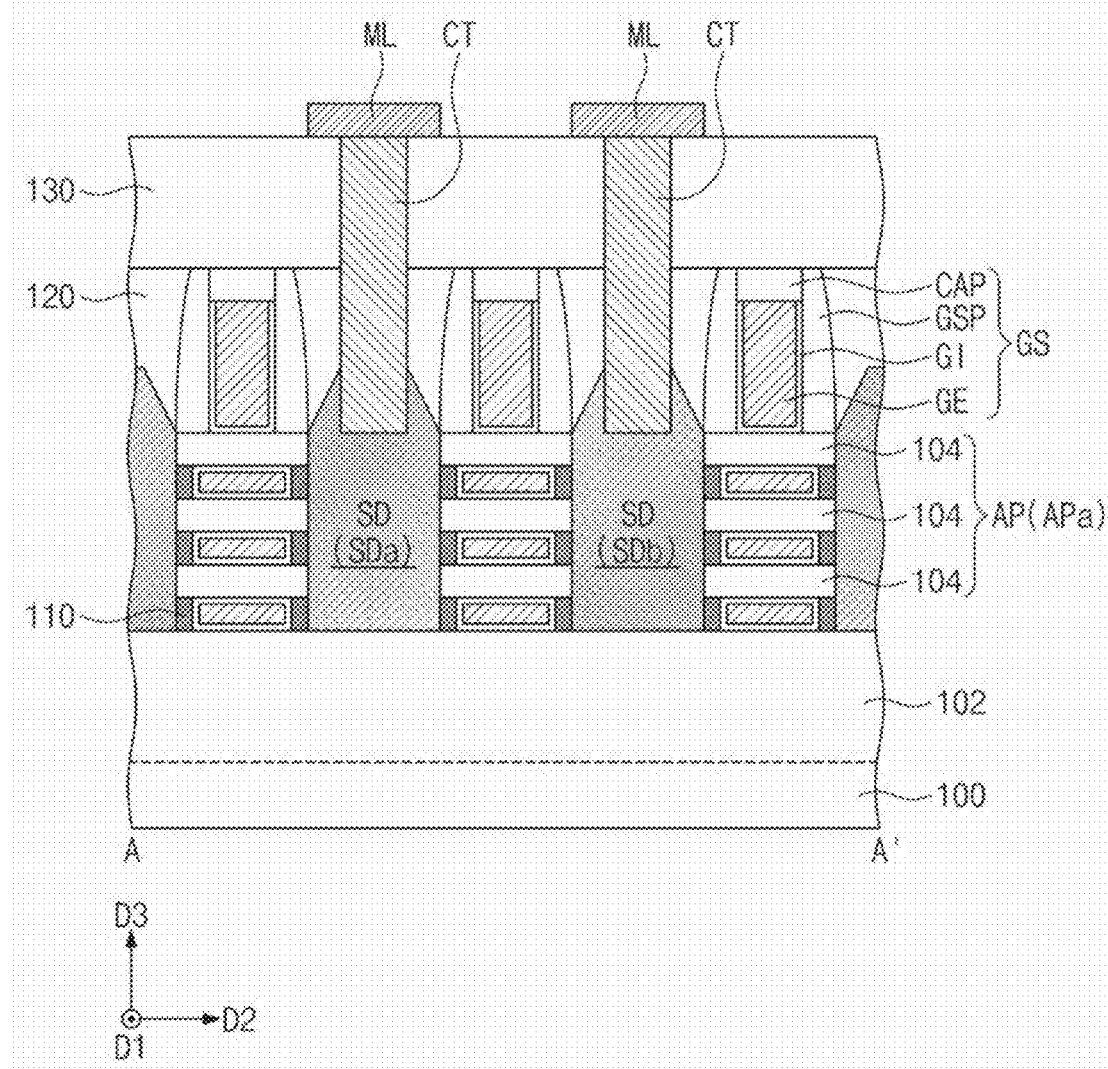
FIGS. 11A, 11B, and 11C illustrate cross-sectional views respectively taken along lines A-A', B-B', and C-C' of FIG. 10.
Figure 11B:
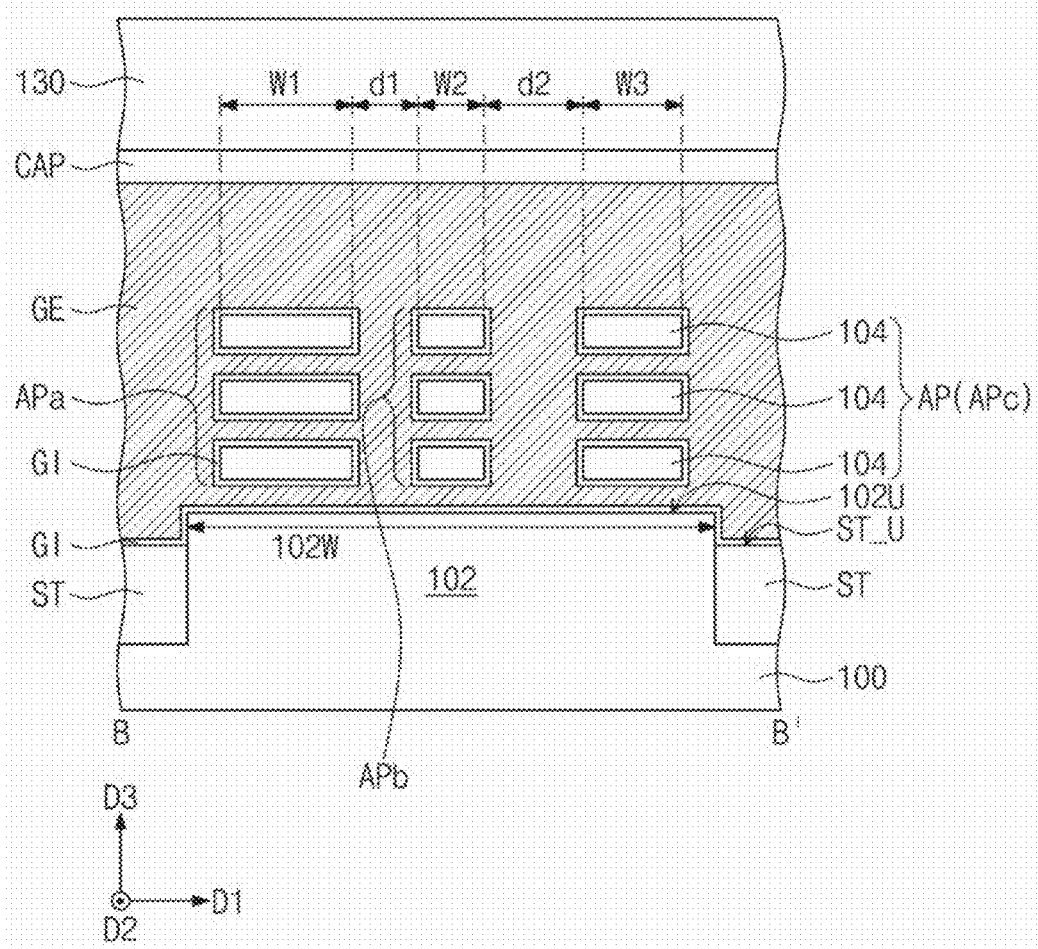
Figure 11C:
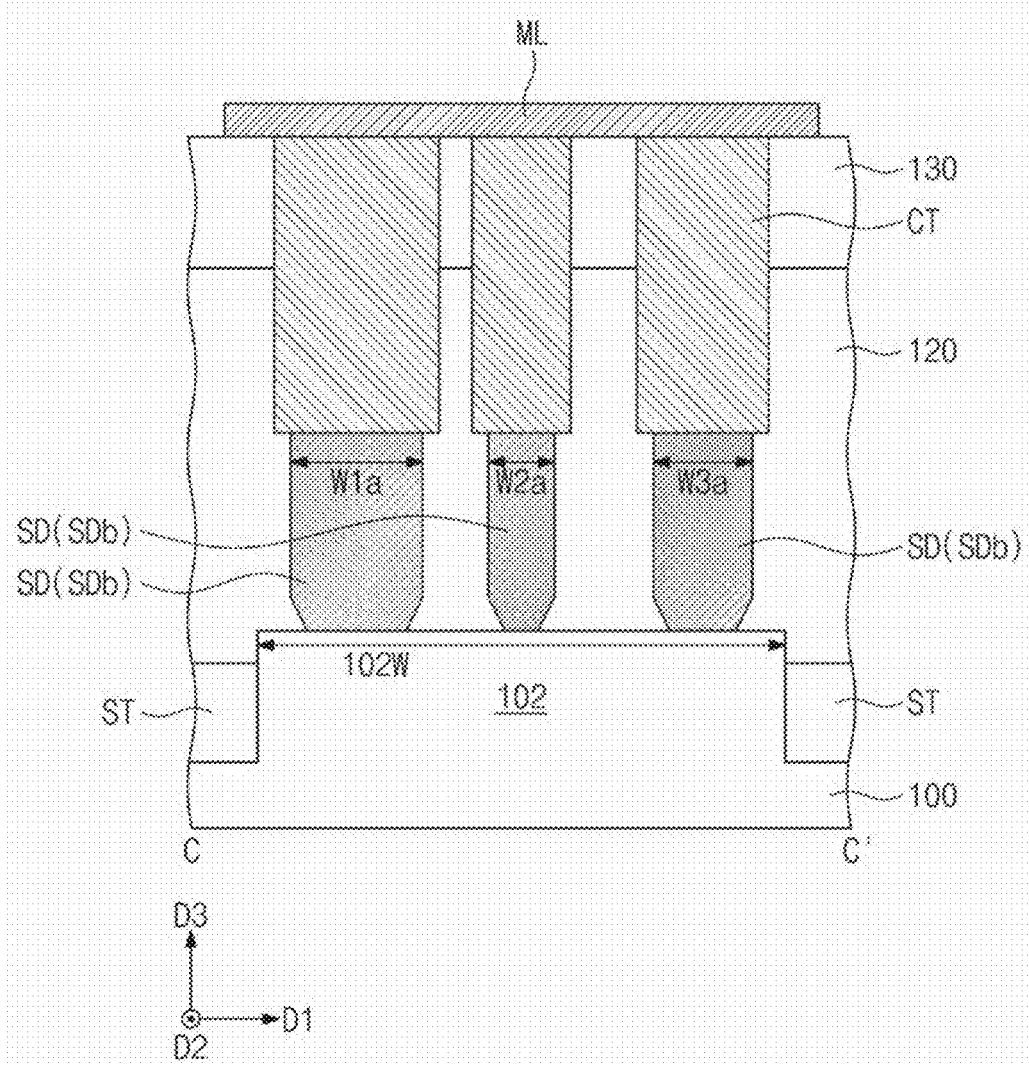

FIG. 10 illustrates a plan view showing a semiconductor device according to some example embodiments of inventive concepts. FIGS. 11A, 11B, and 11C illustrate cross-sectional views respectively taken along lines A-A', B-B', and C-C' of FIG. 10. The following semiconductor device is similar to that discussed with reference to FIGS. 1 and 2A to 2C, and thus the major differences between the semiconductor devices will be described below in the interest of brevity of description.

Referring to FIGS. 10, 11A, 11B, and 11C, the contact plugs CT may penetrate the upper and lower interlayer dielectric layers 130 and 120 and have electrical connection with the source/drain patterns SD. According to some example embodiments, the source patterns SDa of the source/drain patterns SD may be coupled to corresponding ones of the contact plugs CT. The contact plugs CT coupled to corresponding source patterns SDa may be spaced apart from each other in the first direction D1 on one side of the gate structure GS. The drain patterns SDb of the source/drain patterns SD may be coupled to corresponding ones of the contact plugs CT. The contact plugs CT coupled to corresponding drain patterns SDb may be spaced apart from each other in the first direction D1 on other side of the gate structure GS. The upper interlayer dielectric layer 130 may be provided thereon with connection lines ML coupled to the contact plugs CT. The contact plugs CT coupled to corresponding source patterns SDa may be connected to each other through a corresponding one of the connection lines ML. The contact plugs CT coupled to corresponding drain patterns SDb may be connected to each other through another corresponding one of the connection lines ML. Except for the difference mentioned above, a semiconductor device according to some example embodiments may be substantially the same as the semiconductor device discussed with reference to FIGS. 1 and 2A to 2C.

Figure 12:
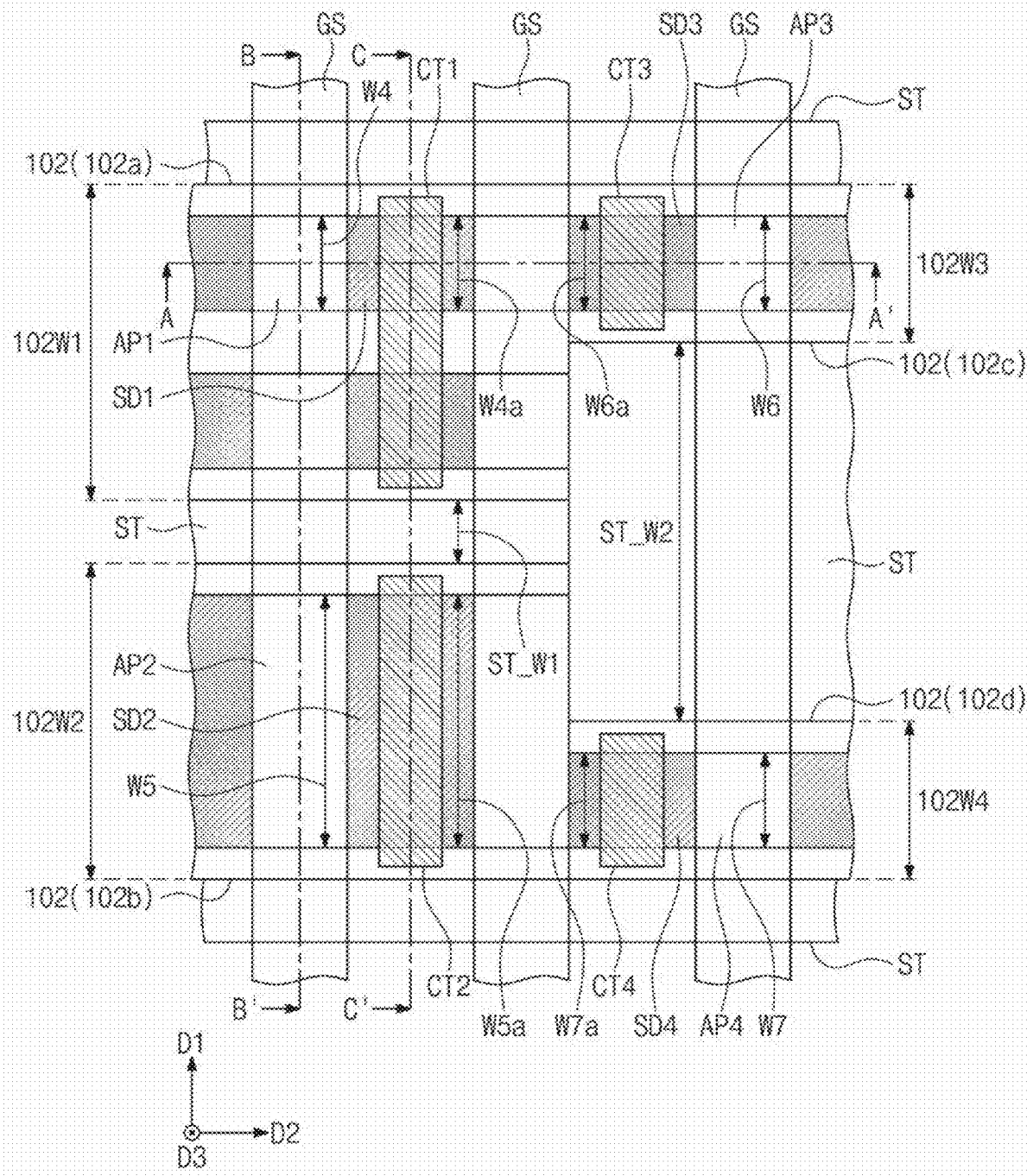
FIG. 12 illustrates a plan view showing a semiconductor device according to some example embodiments of inventive concepts.
Figure 13A:
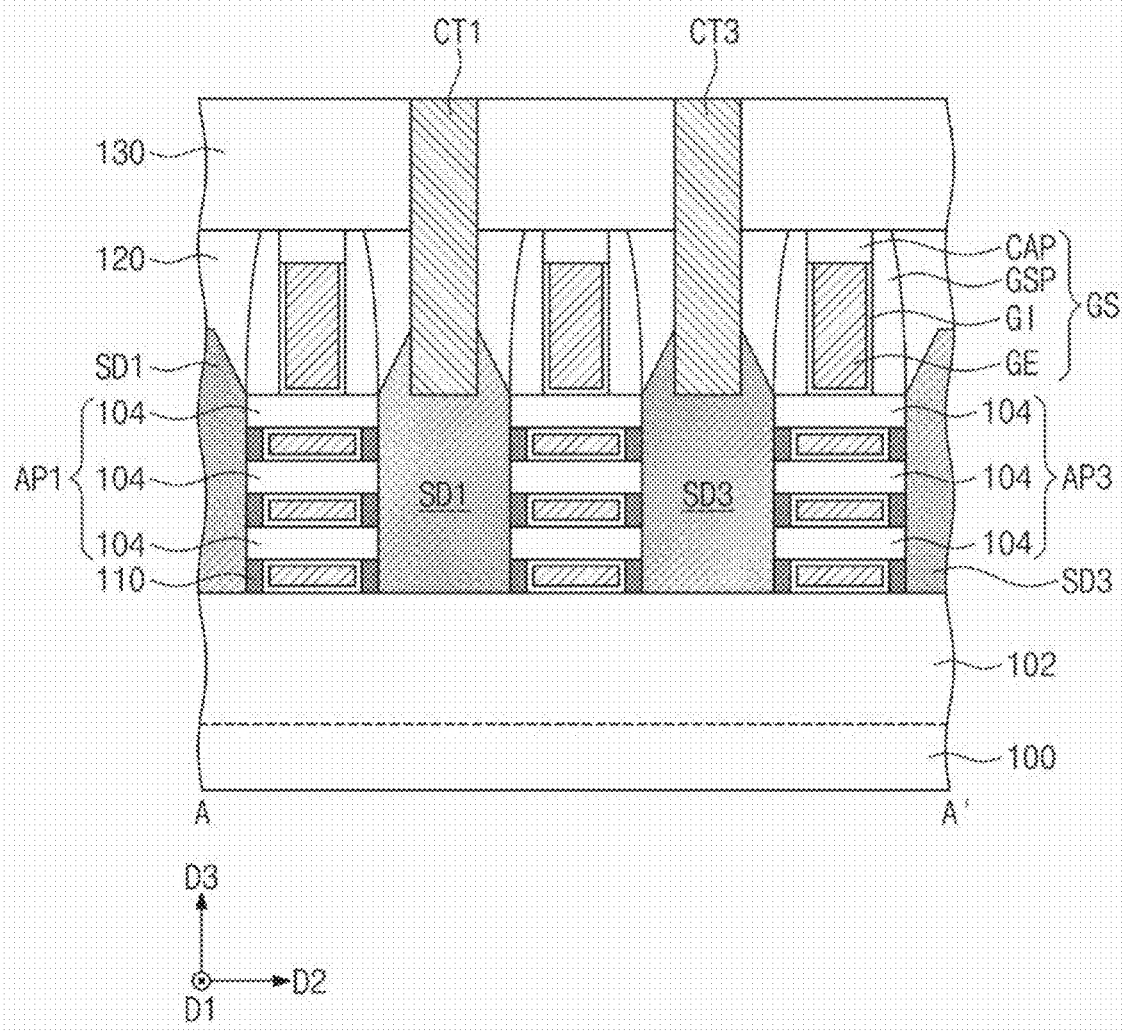
FIGS. 13A, 13B, and 13C illustrate cross-sectional views respectively taken along lines A-A', B-B', and C-C' of FIG. 12.
Figure 13B:
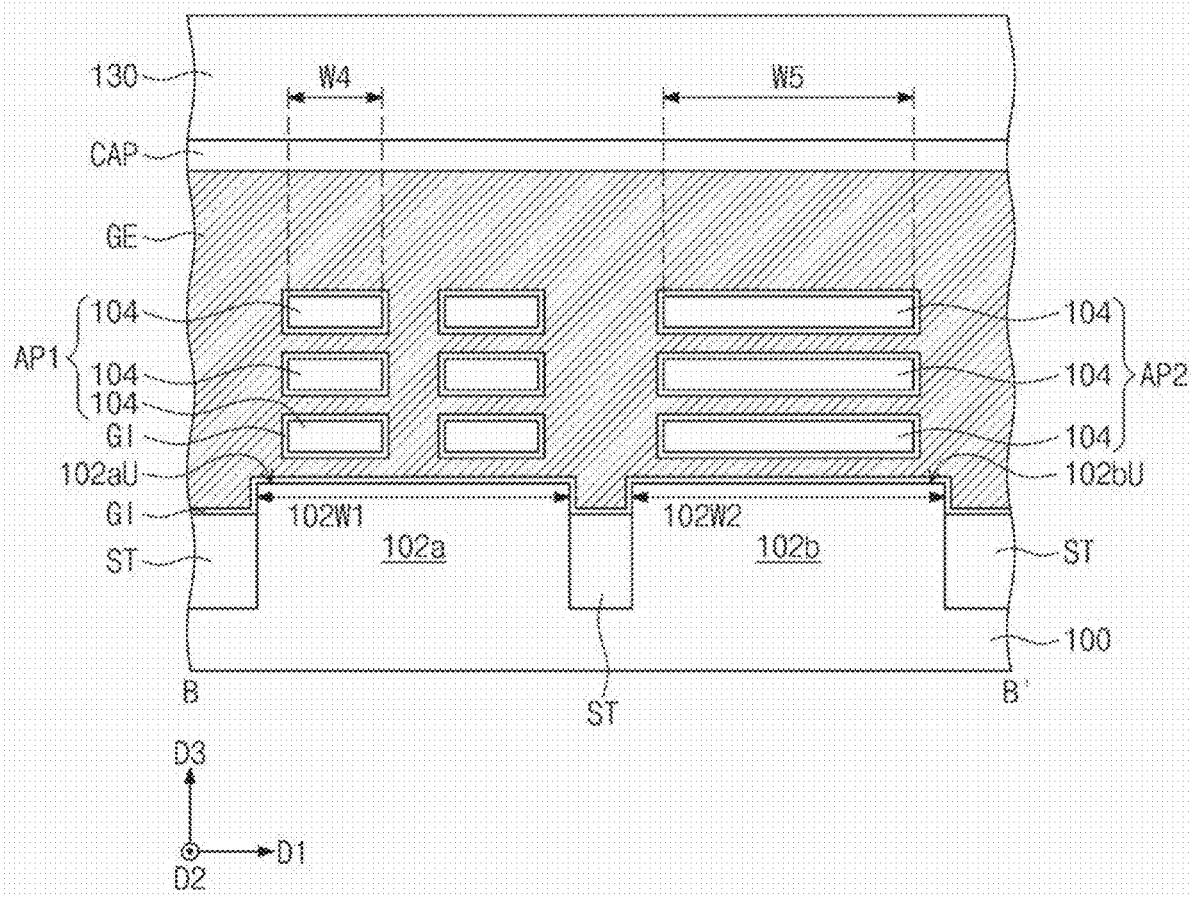
Figure 13C:
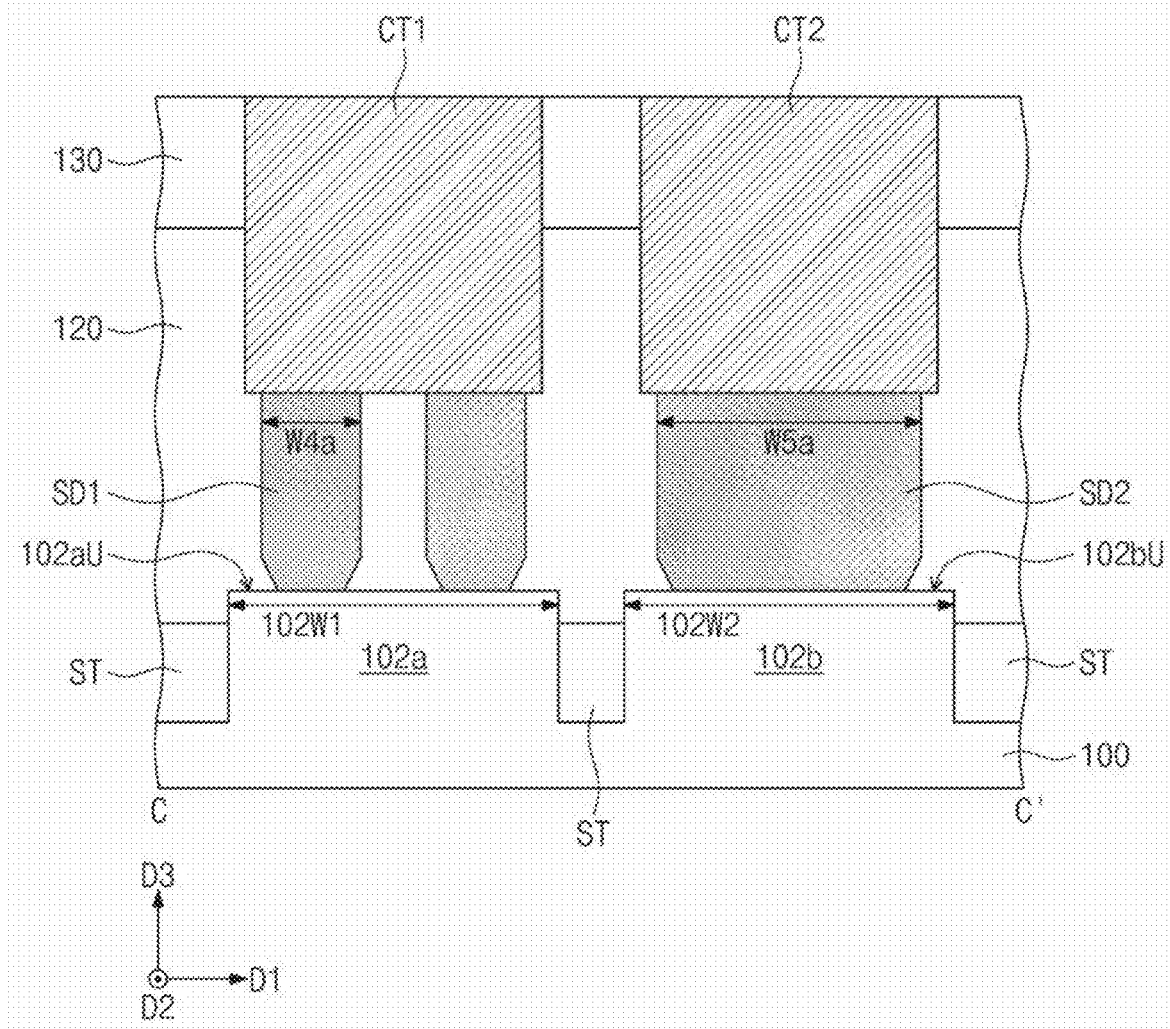

FIG. 12 illustrates a plan view showing a semiconductor device according to some example embodiments of inventive concepts. FIGS. 13A, 13B, and 13C illustrate cross-sectional views respectively taken along lines A-A', B-B', and C-C' of FIG. 12. The following semiconductor device is similar to that discussed with reference to FIGS. 1 and 2A to 2C, and thus the major differences between the semiconductor devices will be described below in the interest of brevity of description.

Referring to FIGS. 12, 13A, 13B, and 13C, a plurality of active regions 102 may be disposed on the substrate 100. The plurality of active regions 102 may protrude along the third direction D3 from the substrate 100. The substrate 100 may be provided thereon with the device isolation patterns ST that define the plurality of active regions 102. The device isolation patterns ST may be disposed on lateral surfaces of the plurality of active regions 102. The plurality of active regions 102 may include a first active region 102a and a second active region 102b that are spaced apart from each other in the first direction D1, a third active region 102c that extends in the second direction D2 from the first active region 102a, and a fourth active region 102d that extends in the second direction D2 from the second active region 102b. The first active region 102a and the second active region 102b may be spaced apart from each other in the first direction D1 across a corresponding one of the device isolation patterns ST, and the third active region 102c and the fourth active region 102d may be spaced apart from each other in the first direction D1 across a corresponding one of the device isolation patterns ST.

Each of the first, second, third, and fourth active regions 102a, 102b, 102c, and 102d may have a width along the first direction D1. The first active region 102a may have a width 102W1 greater than a width 102W3 of the third active region 102c, and the second active region 102b may have a width 102W2 greater than or less than a width 102W4 of the fourth active region 102d. In some example embodiments, the width 102W1 of the first active region 102a may be substantially the same as the width 102W2 of the second active region 102b.

A plurality of first channel patterns AP1 may be disposed on the first active region 102a. The first channel patterns AP1 may be spaced apart from each other in the first direction D1 on a top surface 102aU of the first active region 102a. Each of the first channel patterns AP1 may include a plurality of first semiconductor patterns 104 that are stacked along a direction (e.g., the third direction D3) perpendicular to the top surface 102aU of the first active region 102a. Each of the first channel patterns AP1 may have a width W4 along the first direction D1. The width W4 of each of the first channel patterns AP1 may be a width of each of the first semiconductor patterns 104 included in each of the first channel patterns AP1. The width 102W1 of the first active region 102a may be greater than a sum of the widths W4 of the first channel patterns AP1. The width 102W1 of the first active region 102a may be the same as or greater than a sum of the widths W4 of the first channel patterns AP1 and a distance between the first channel patterns AP1. The distance between the first channel patterns AP1 may be a distance in the first direction D1 between adjacent ones of the first channel patterns AP1.

A second channel pattern AP2 may be disposed on the second active region 102b. The second channel pattern AP2 may include a plurality of second semiconductor patterns 104 that are stacked along a direction (e.g., the third direction D3) perpendicular to a top surface 102bU of the second active region 102b. The second channel pattern AP2 may have a width W5 along the first direction D1. The width W5 of the second channel pattern AP2 may be a width of each of the second semiconductor patterns 104 included in the second channel pattern AP2. The width W5 of the second channel pattern AP2 may be greater than or less than the width W4 of each of the first channel patterns AP1. The width W5 of the second channel pattern AP2 may be greater than a sum of the widths W4 of the first channel patterns AP1.

A third channel pattern AP3 may be disposed on the third active region 102c. The third channel pattern AP3 may include a plurality of third semiconductor patterns 104 that are stacked along a direction (e.g., the third direction D3) perpendicular to a top surface of the third active region 102c. The third channel pattern AP3 may have a width W6 along the first direction D1. The width W6 of the third channel pattern AP3 may be a width of each of the third semiconductor patterns 104 included in the third channel pattern AP3. The width W6 of the third channel pattern AP3 may be less than the width W5 of the second channel pattern AP2, and substantially the same as the width W4 of each of the first channel patterns AP1.

A fourth channel pattern AP4 may be disposed on the fourth active region 102d. The fourth channel pattern AP4 may include a plurality of fourth semiconductor patterns 104 that are stacked along direction (e.g., the third direction D3) perpendicular to a top surface of the fourth active region 102d. The fourth channel pattern AP4 may have a width W7 along the first direction D1. The width W7 of the fourth channel pattern AP4 may be a width of each of the fourth semiconductor patterns 104 included in the fourth channel pattern AP4. The width W7 of the fourth channel pattern AP4 may be less than the width W5 of the second channel pattern AP2, and substantially the same as the width W4 of each of the first channel patterns AP1.

In some example embodiments, when viewed in plan, the third channel pattern AP3 may be disposed aligned along the second direction D2 with one of the first channel patterns AP1. When viewed in plan, the fourth channel pattern AP4 may be disposed aligned along the second direction D2 with an edge of the second channel pattern AP2. Accordingly, the device isolation pattern ST between the third and fourth active regions 102c and 102d may have a width ST_W2 greater than a width ST_W1 of the device isolation pattern ST between the first and second active regions 102a and 102b.

First source/drain patterns SD1 may be disposed on the first active region 102a. The first source/drain patterns SD1 may be disposed on sides of the first channel patterns AP1, and may be spaced apart from each other in the first direction D1 on the top surface 102aU of the first active region 102a. The first source/drain patterns SD1 may be connected to corresponding first channel patterns AP1. Each of the first source/drain patterns SD1 may have a width W4a along the first direction D1. The width 102W1 of the first active region 102a may be greater than a sum of the widths W4a of the first source/drain patterns SD1.

A second source/drain pattern SD2 may be disposed on the second active region 102b. The second source/drain pattern SD2 may be disposed on one side of the second channel pattern AP2 and connected to the second channel pattern AP2. The second source/drain pattern SD2 may have a width W5a along the first direction D1. The width W5a of the second source/drain pattern SD2 may be greater than the width W4a of each of the first source/drain patterns SD1 and a sum of the widths W4a of the first source/drain patterns SD1.

A third source/drain pattern SD3 may be disposed on the third active region 102c. The third source/drain pattern SD3 may be disposed on one side of the third channel pattern AP3 and connected to the third channel pattern AP3. The third source/drain pattern SD3 may have a width W6a along the first direction D1. The width W6a of the third source/drain pattern SD3 may be less than the width W5a of the second source/drain pattern SD2 and substantially the same as the width W4a of each of the first source/drain patterns SD1.

A fourth source/drain pattern SD4 may be disposed on the fourth active region 102d. The fourth source/drain pattern SD4 may be disposed on one side of the fourth channel pattern AP4 and connected to the fourth channel pattern AP4. The fourth source/drain pattern SD4 may have a width W7a along the first direction D1. The width W7a of the fourth source/drain pattern SD4 may be less than the width W5a of the second source/drain pattern SD2 and substantially the same as the width W4a of each of the first source/drain patterns SD1.

A plurality of gate structures GS may be disposed to run across the active regions 102. The gate structures GS may extend in the first direction D1 and may be spaced apart from each other in the second direction D2. One of the gate structures GS may run across the first and second active regions 102a and 102b and the device isolation pattern ST between the first and second active regions 102a and 102b, and may cover the plurality of first channel patterns AP1 and the second channel pattern AP2. Another one of the gate structures GS may run across the third and fourth active regions 102c and 102d and the device isolation pattern ST between the third and fourth active regions 102c and 102d, and may cover the third and fourth channel patterns AP3 and AP4.

A first contact plug CT1 and a second contact plug CT2 may be disposed spaced apart from each other in the first direction D1 on one side of the one gate structure GS. The first contact plug CT1 may extend in the first direction D1 to connect the first source/drain patterns SD1 to each other, and the second contact plug CT2 may be connected to the second source/drain pattern SD2. A third contact plug CT3 and a fourth contact plug CT4 may be disposed spaced apart from each other in the first direction D1 on one side of the other one gate structure GS. The third contact plug CT3 and the fourth contact plug CT4 may be respectively connected to the third source/drain pattern SD3 and the fourth source/drain pattern SD4.

Figure 14:
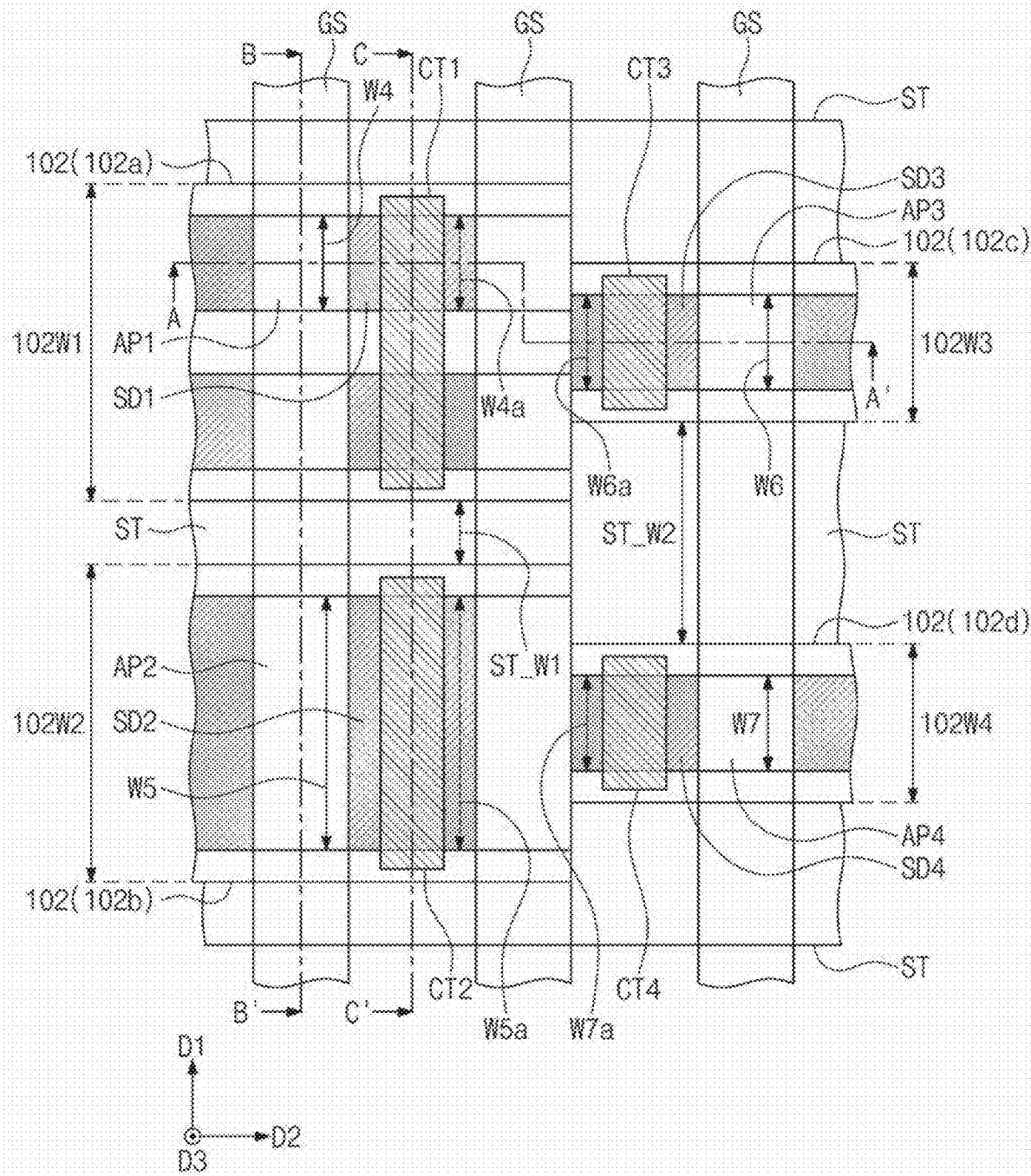
FIG. 14 illustrates a plan view showing a semiconductor device according to some example embodiments of inventive concepts.
Figure 15:
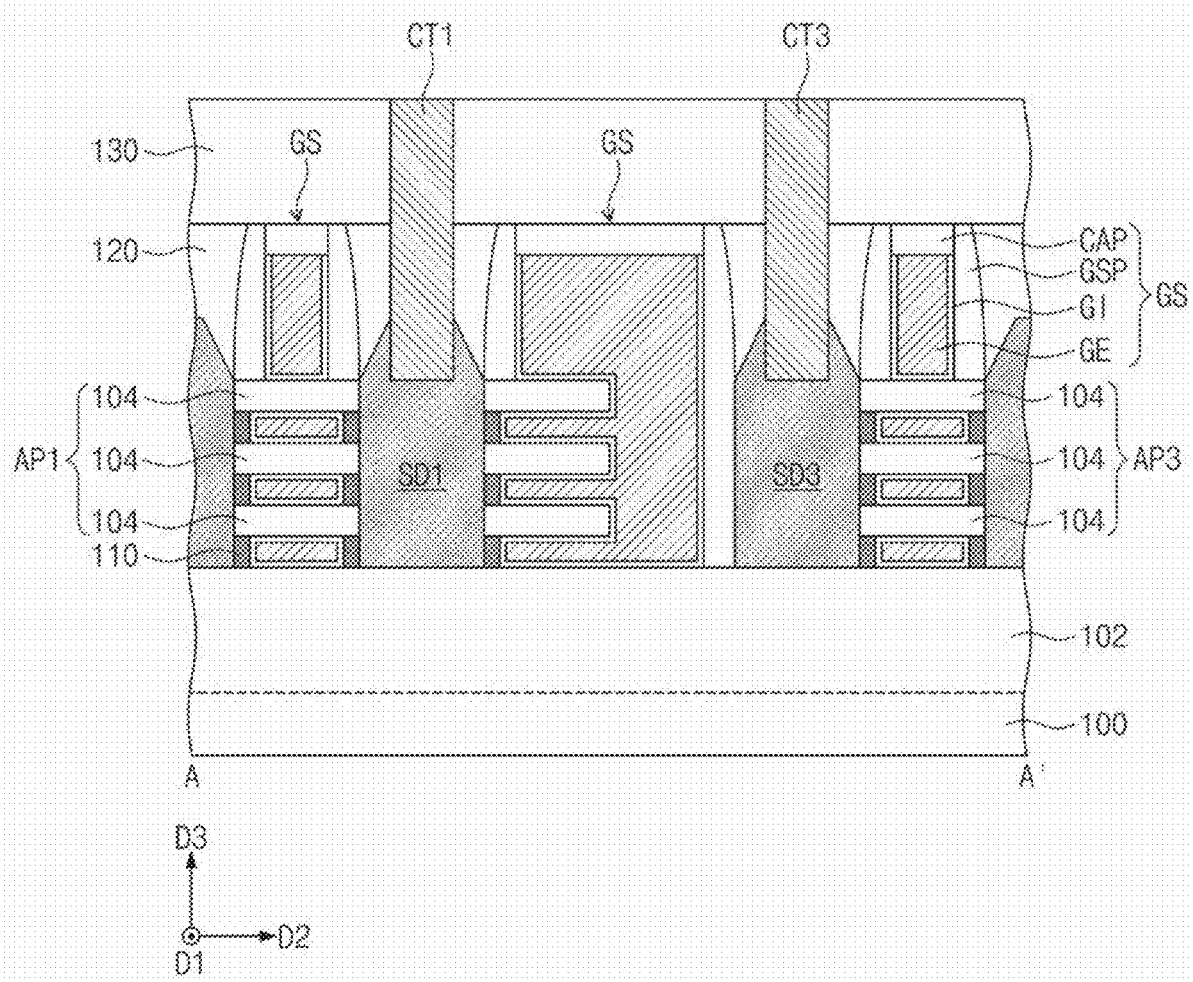
FIG. 15 illustrates a cross-sectional view taken along line A-A' of FIG. 14.

FIG. 14 illustrates a plan view showing a semiconductor device according to some example embodiments of inventive concepts. FIG. 15 illustrates a cross-sectional view taken along line A-A' of FIG. 14. A cross-sectional view taken along line B-B' of FIG. 14 is the same as that shown in FIG. 13B, and a cross-sectional view taken along line C-C' of FIG. 14 is the same as that shown in FIG. 13C.

Referring to FIGS. 14 and 15, according to the some example embodiments, when viewed in plan, the third channel pattern AP3 may be disposed offset in the second direction D2 from the first channel patterns AP1. When viewed in plan, the fourth channel pattern AP4 may be disposed aligned along the second direction D2 with a central portion of the second channel pattern AP2. Accordingly, the width ST_W2 of the device isolation pattern ST between the third and fourth active regions 102c and 102d may be greater than the width ST_W1 of the device isolation pattern ST between the first and second active regions 102a and 102b. Except for the difference mentioned above, a semiconductor device according to some example embodiments is substantially the same as the semiconductor device discussed with reference to FIGS. 12, 13A, 13B, and 13C.

Figure 16:
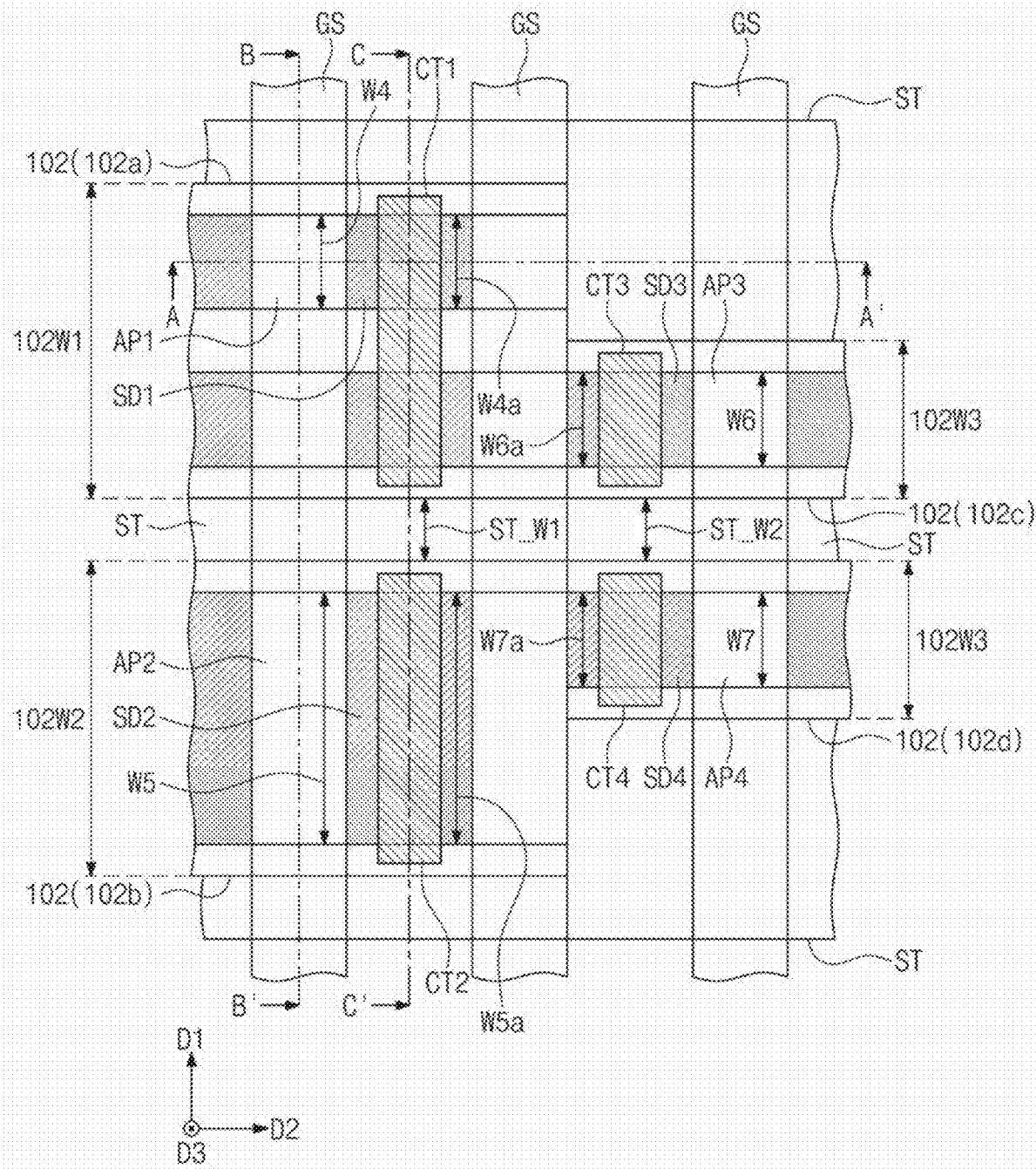
FIG. 16 illustrates a plan view showing a semiconductor device according to some example embodiments of inventive concepts.
Figure 17:
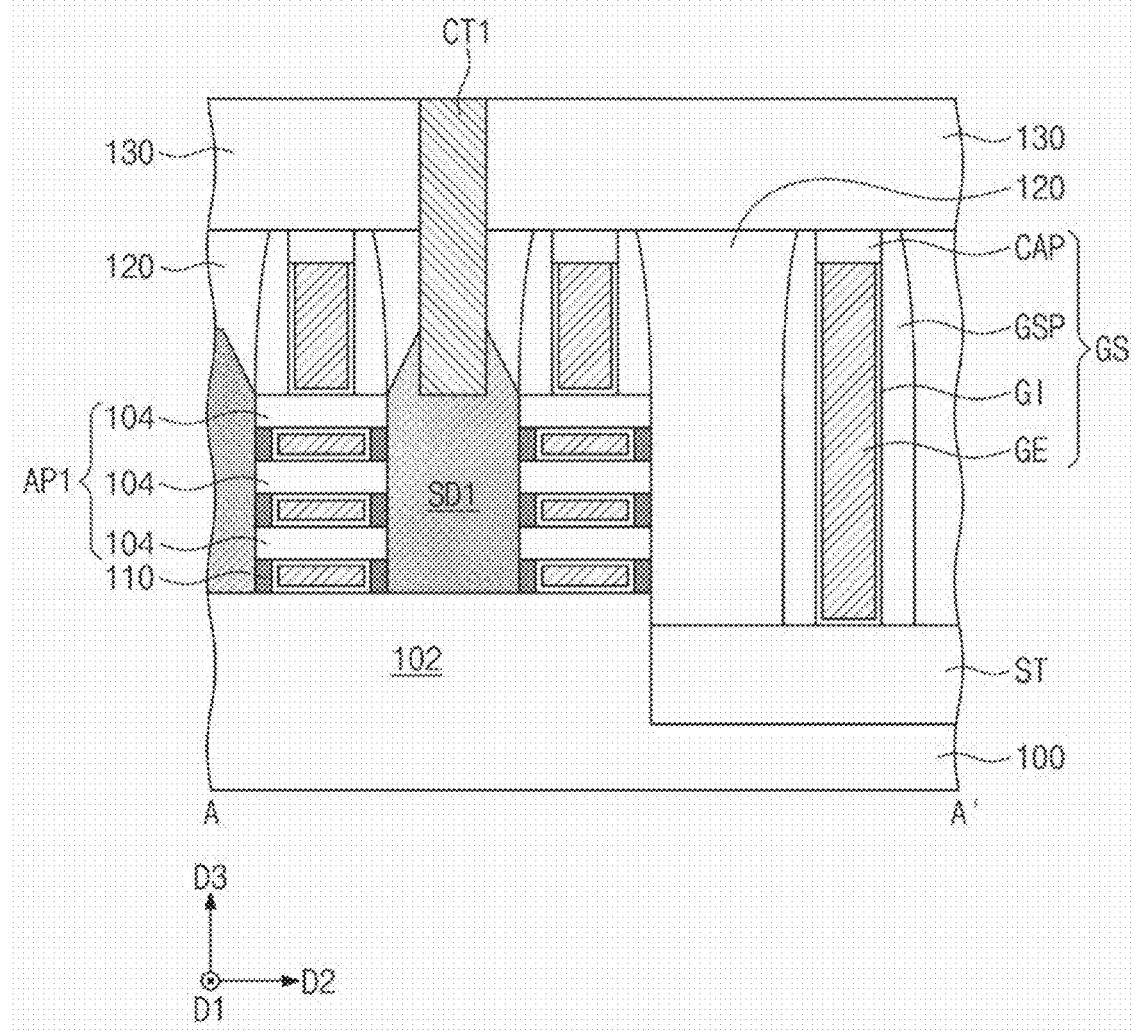
FIG. 17 illustrates a cross-sectional view taken along line A-A' of FIG. 16.

FIG. 16 illustrates a plan view showing a semiconductor device according to some example embodiments of inventive concepts. FIG. 17 illustrates a cross-sectional view taken along line A-A' of FIG. 16. A cross-sectional view taken along line B-B' of FIG. 16 is the same as that shown in FIG. 13B, and a cross-sectional view taken along line C-C' of FIG. 16 is the same as that shown in FIG. 13C.

Referring to FIGS. 16 and 17, according to some example embodiments, when viewed in plan, the third channel pattern AP3 may be disposed aligned along the second direction D2 with one of the first channel patterns AP1. When viewed in plan, the fourth channel pattern AP4 may be disposed aligned along the second direction D2 with an edge of the second channel pattern AP2. In this case, the width ST_W2 of the device isolation pattern ST between the third and fourth active regions 102c and 102d may be substantially the same as the width ST_W1 of the device isolation pattern ST between the first and second active regions 102a and 102b. Except for the difference mentioned above, a semiconductor device according to some example embodiments is substantially the same as the semiconductor device discussed with reference to FIGS. 12, 13A, 13B, and 13C.

Figure 18:
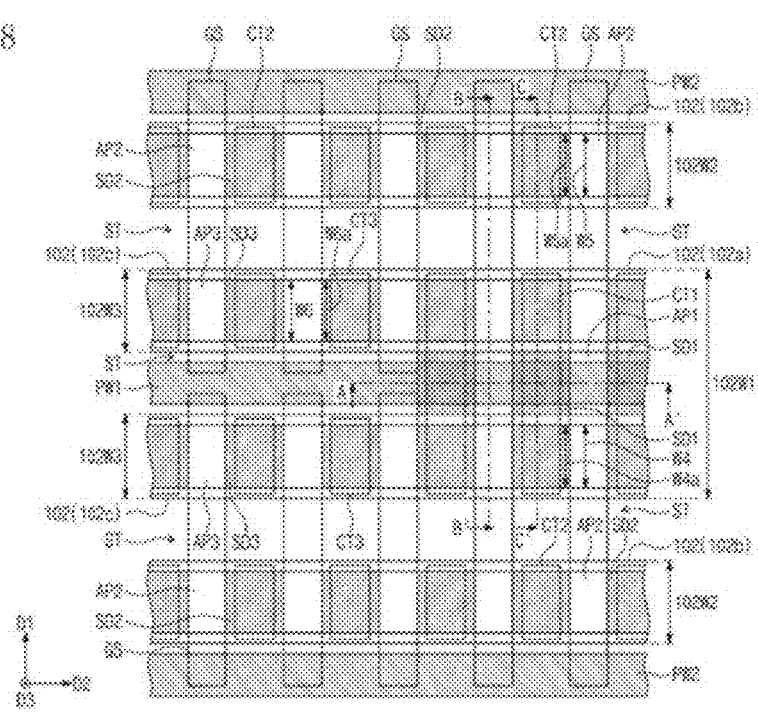
FIG. 18 illustrates a plan view showing a semiconductor device according to some example embodiments of inventive concepts.
Figure 19A:
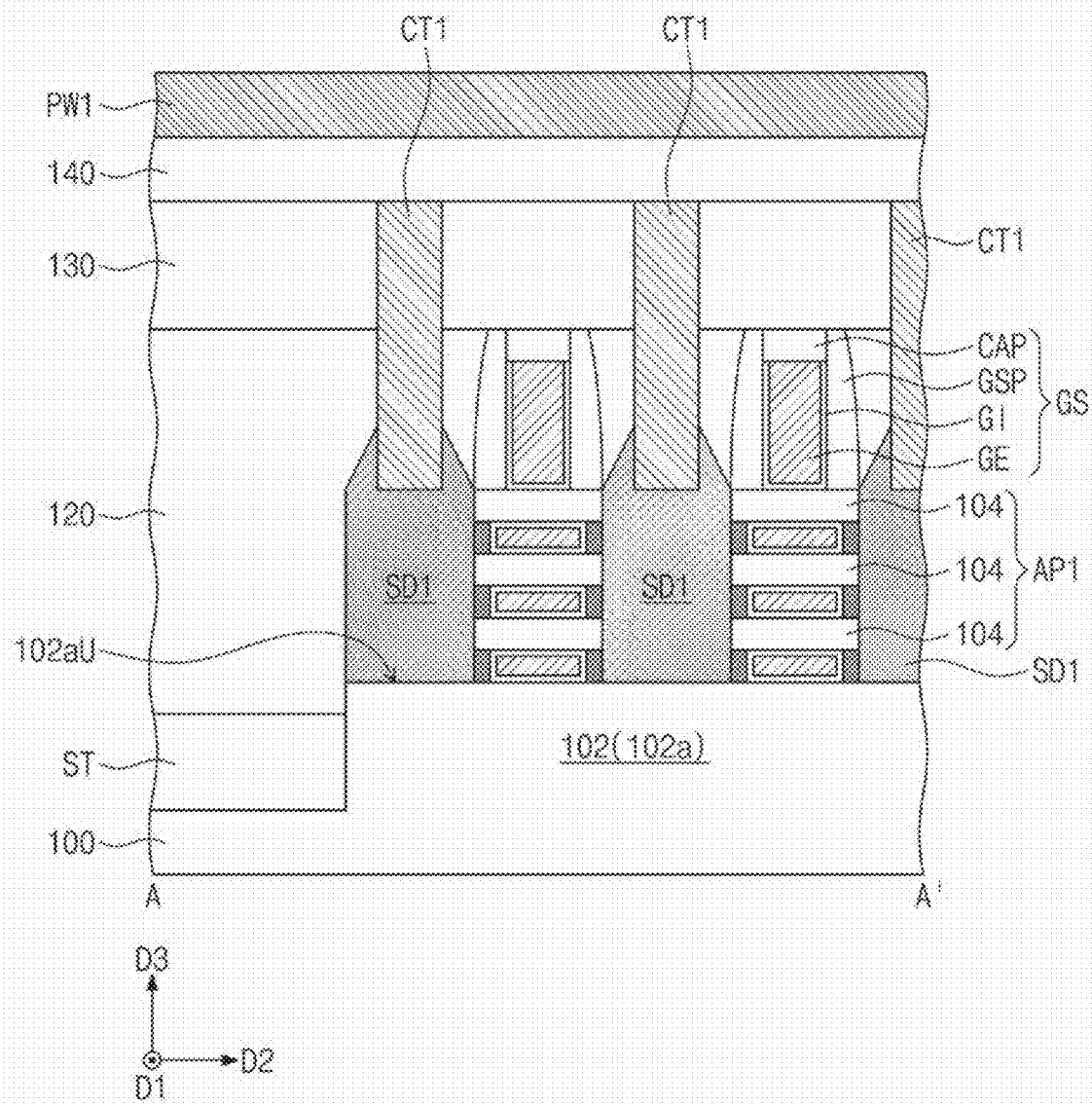
FIGS. 19A, 19B, and 19C illustrate cross-sectional views respectively taken along lines A-A', B-B', and C-C' of FIG. 18.
Figure 19B:
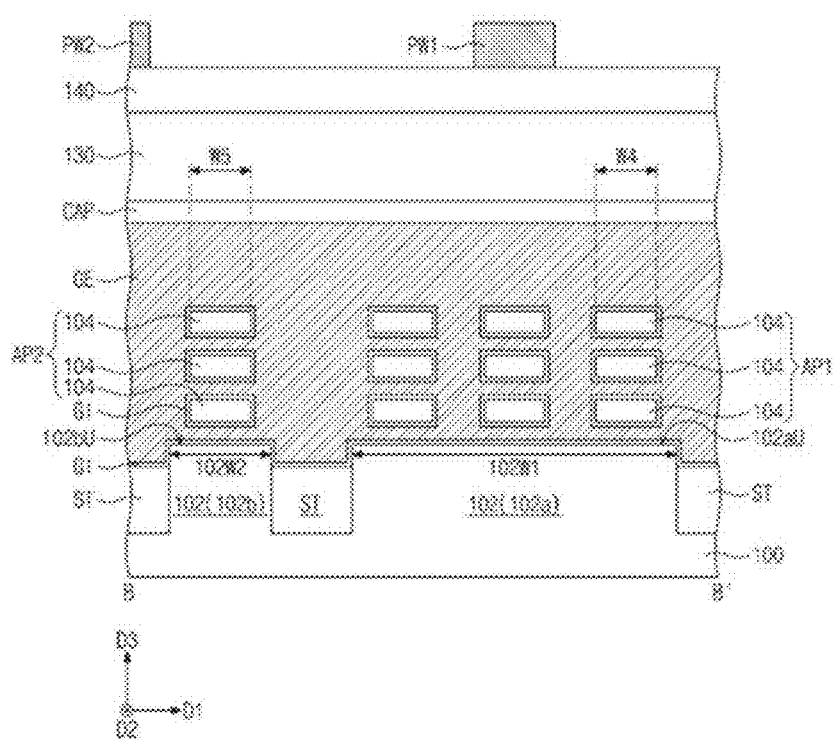
Figure 19C:
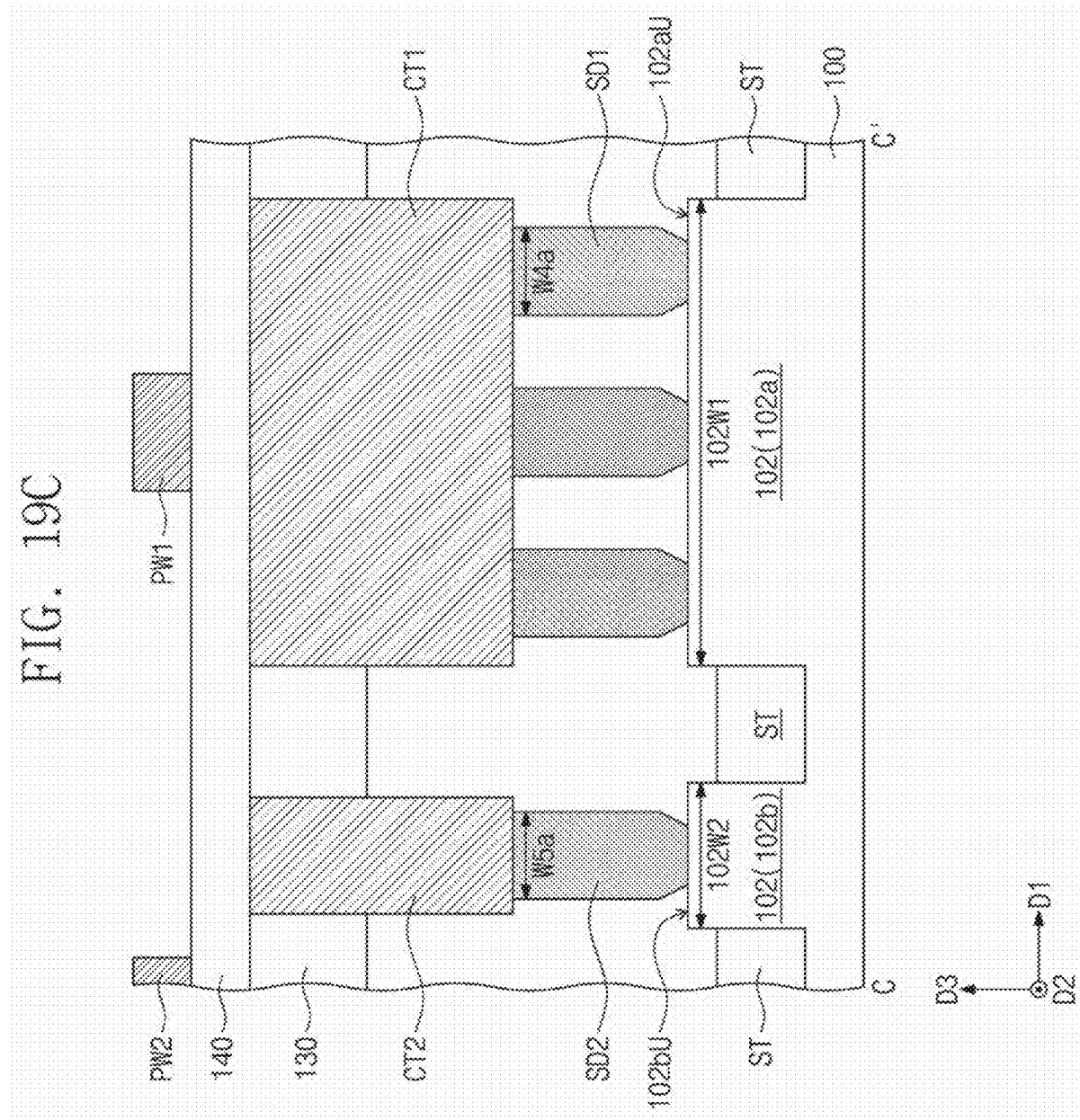

FIG. 18 illustrates a plan view showing a semiconductor device according to some example embodiments of inventive concepts. FIGS. 19A, 19B, and 19C illustrate cross-sectional views respectively taken along lines A-A', B-B', and C-C' of FIG. 18. The following semiconductor device is similar to that discussed with reference to FIGS. 1 and 2A to 2C, and thus the major differences between the semiconductor devices will be described below in the interest of brevity of description.

Referring to FIGS. 18, 19A, 19B, and 19C, a plurality of active regions 102 may be disposed on the substrate 100. The plurality of active regions 102 may protrude along the third direction D3 from the substrate 100. The plurality of active regions 102 may include a first active region 102a and second active regions 102b that are spaced apart from each other in the first direction D1 across the first active region 102a. The second active regions 102b may each have a linear shape that extends in the second direction D2. The plurality of active regions 102 may further include third active regions 102c between the second active regions 102b. The third active regions 102c may be spaced apart from each other in the first direction D1 between the second active regions 102b, and may extend in the second direction D2 to come into connection with the first active region 102a. The first active region 102a and the third active regions 102c may have a first conductive type (e.g., n-type or p-type), and the second active regions 102b may have a second conductive type (e.g., p-type or n-type) different from the first conductive type. Device isolation patterns ST may be interposed between the plurality of active regions 102.

Each of the first, second, and third active regions 102a, 102b, and 102c may have a width along the first direction D1. The first active region 102a may have a width 102W1 greater than a width 102W2 of each of the second active regions 102b and greater than a width 102W3 of each of the third active regions 102c. In certain embodiments, the width 102W1 of the first active region 102a may be greater than a sum of the widths 102W3 of the third active regions 102c.

A plurality of first channel patterns AP1 may be disposed on the first active region 102a. The first channel patterns AP1 may be spaced apart from each other in the first direction D1 on a top surface 102aU of the first active region 102a. Each of the first channel patterns AP1 may include a plurality of first semiconductor patterns 104 that are stacked in a direction (e.g., the third direction D3) perpendicular to the top surface 102aU of the first active region 102a. Each of the first channel patterns AP1 may have a width W4 along the first direction D1. The width W4 of each of the first channel patterns AP1 may be a width of each of the first semiconductor patterns 104 included in each of the first channel patterns AP1. The width 102W1 of the first active region 102a may be greater than a sum of the widths W4 of the first channel patterns AP1. The width 102W1 of the first active region 102a may be the same as or greater than a sum of the widths W4 of the first channel patterns AP1 and distances between the first channel patterns AP1. Each of the distances between the first channel patterns AP1 may be a distance along the first direction D1 between a pair of adjacent ones of the first channel patterns AP1.

A second channel pattern AP2 may be disposed on each of the second active regions 102b. The second channel pattern AP2 may include a plurality of second semiconductor patterns 104 that are stacked along a direction (e.g., the third direction D3) perpendicular to a top surface 102bU of each of the second active regions 102b. The second channel pattern AP2 may have a width W5 along the first direction D1. The width W5 of the second channel pattern AP2 may be a width of each of the second semiconductor patterns 104 included in the second channel pattern AP2. The width W5 of the second channel pattern AP2 may be substantially the same as the width W4 of each of the first channel patterns AP1. When viewed in plan, the second channel pattern AP2 may be disposed aligned along the first direction D1 with the first channel patterns AP1.

A third channel pattern AP3 may be disposed on each of the third active regions 102c. The third channel pattern AP3 may include a plurality of third semiconductor patterns that are stacked along a direction (e.g., the third direction D3) perpendicular to a top surface of each of the third active regions 102c. The third channel pattern AP3 may have a width W6 along the first direction D1. The width W6 of the third channel pattern AP3 may be a width of each of the third semiconductor patterns included in the third channel pattern AP3. The width W6 of the third channel pattern AP3 may be substantially the same as the width W4 of each of the first channel patterns AP1. When viewed in plan, the third channel pattern AP3 may be disposed aligned along the second direction D2 with one of the first channel patterns AP1. An additional second channel pattern AP2 may be disposed on each of the second active regions 102b. When viewed in plan, the additional second channel pattern AP2 may be disposed aligned along the first direction D1 with the third channel pattern AP3.

First source/drain patterns SD1 may be disposed on the first active region 102a. The first source/drain patterns SD1 may be disposed on sides of the first channel patterns AP1, and may be spaced apart from each other in the first direction D1 on the top surface 102aU of the first active region 102a. The first source/drain patterns SD1 may be connected to corresponding first channel patterns AP1. Each of the first source/drain patterns SD1 may have a width W4a along the first direction D1. The width 102W1 of the first active region 102a may be greater than a sum of the widths W4a of the first source/drain patterns SD1.

A second source/drain pattern SD2 may be disposed on each of the second active regions 102b. The second source/drain pattern SD2 may be disposed on one side of the second channel pattern AP2 and connected to the second channel pattern AP2. The second source/drain pattern SD2 may have a width W5a along the first direction D1. The width W5a of the second source/drain pattern SD2 may be substantially the same as the width W4a of each of the first source/drain patterns SD1.

A third source/drain pattern SD3 may be disposed on each of the third active regions 102c. The third source/drain pattern SD3 may be disposed on one side of the third channel pattern AP3 and connected to the third channel pattern AP3. The third source/drain pattern SD3 may have a width W6a along the first direction D1. The width W6a of the third source/drain pattern SD3 may be substantially the same as the width W4a of each of the first source/drain patterns SD1. An additional second source/drain pattern SD2 may be disposed on each of the second active regions 102b. The additional second source/drain pattern SD2 may be disposed one side of the additional second channel pattern AP2 and connected to the additional second channel pattern AP2.

A plurality of gate structures GS may be disposed to run across the active regions 102. The gate structures GS may extend in the first direction D1, and may be spaced apart from each other in the second direction D2. One of the gate structures GS may run across the first and second active regions 102a and 102b and the device isolation patterns ST between the first and second active regions 102a and 102b, and may cover the plurality of first channel patterns AP1 and the second channel pattern AP2. Other one of the gate structures GS may run across one of the second active regions 102b, one of the third active regions 102c, and the device isolation pattern ST between the one of the second active regions 102b and the one of the third active regions 102c, and may cover the additional second channel pattern AP2 and the third channel pattern AP3.

A first contact plug CT1 and a second contact plug CT2 may be disposed spaced apart from each other in the first direction D1 on one side of the one of the gate structures GS. The first contact plug CT1 may extend in the first direction D1 to connect the first source/drain patterns SD1 to each other, and the second contact plug CT2 may be connected to the second source/drain pattern SD2. A third contact plug CT3 and an additional second contact plug CT2 may be disposed spaced apart from each other in the first direction D1 on one side of the other one of the gate structures GS. The third contact plug CT3 and the additional second contact plug CT2 may be respectively connected to the third source/drain pattern SD3 and the additional second source/drain pattern SD2.

The substrate 100 may be provided thereon with a first power line PW1 and second power lines PW2 that are spaced apart from each other in the first direction D1 across the first power line PW1. The first and second power lines PW1 and PW2 may be spaced apart from each other in the first direction D1 and may extend in the second direction D2. The first power line PW1 may be disposed on the device isolation pattern ST between the third active regions 102c, and may extend in the second direction D2 to run across the first active region 102a. The first power line PW1 may run across the first contact plug CT1 and the gate structures GS on the first active region 102a. The second power lines PW2 may be disposed adjacent to corresponding second active regions 102b. For example, a drain voltage may be applied through the first power line PW1, and a source voltage may be applied through each of the second power lines PW2. The first and second power lines PW1 and PW2 may include a conductive material such as, but not limited to be, a metal such as tungsten.

Figure 20:
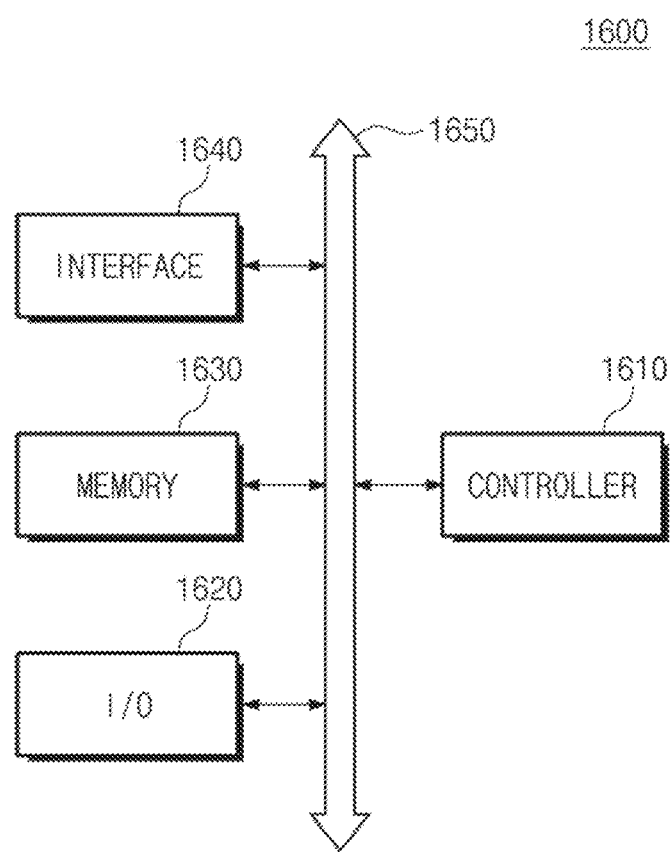
FIG. 20 is a block diagram of an electronic system according to some example embodiments.

FIG. 20 is a block diagram of an electronic system 1600 according to some example embodiments.

The electronic system 1600 may include a controller 1610, an input/output (I/O) device 1620, a memory 1630, and/or an interface 1640, which may be connected to one another by a bus 1650.

The controller 1610 may include at least one of a microprocessor (MP), a digital signal processor (DSP), and processors similar thereto. The I/O device 1620 may include at least one of a keypad, a keyboard, or a display. The memory 1630 may be used to store commands executed by the controller 1610. For example, the memory 1630 may be used to store user data.

The electronic system 1600 may include at least one of the semiconductor devices described with reference to FIGS. 1 to 19C according to some example embodiments or modifications thereof. For example, at least one of the controller 1610, the I/O 1620, the memory 1630, or the interface 1640 may include a semiconductor device described above with reference to FIGS. 1 to 19C.

According to inventive concepts, a plurality of channel patterns may be disposed spaced apart from each other in a first direction on a single active region, and a gate electrode may extend in the first direction on the single active region and may cover the plurality of channel patterns. A plurality of source/drain patterns may be disposed on the single active region on opposite sides of the channel patterns. Each of the plurality of channel patterns may include semiconductor patterns that are spaced apart from each other in a direction perpendicular to a top surface of the active region. Because the channel patterns are disposed spaced apart from each other in the first direction on the single active region, the channel patterns which include the semiconductor patterns may be easily formed. Moreover, the channel patterns and the source/drain patterns may have their widths that are variously adjusted, and accordingly, a transistor including the channel patterns, the source/drain patterns, and the gate electrode may be achieved to have various characteristics such as various electrical characteristics.

As a result, it may be possible to easily or more easily fabricate a semiconductor device and to increase the degree of freedom for designing a semiconductor integrated circuit including the transistor.

The aforementioned description provides some example embodiments for explaining inventive concepts. Therefore, inventive concepts are not limited to the embodiments described above, and it will be understood by one of ordinary skill in the art that variations in form and detail may be made therein without departing from the spirit and essential features of inventive concepts. Unless otherwise stated, embodiments disclosed herein are not to be construed as mutually exclusive with one another. For example, to the extent that one embodiment includes one feature and another embodiment includes another feature, other embodiments may include a combination of features included in the different embodiments.

What is claimed is:
1. A semiconductor device, comprising:
a first active region and a second active region protruding upwardly from a substrate and spaced apart from each other in a first direction;
a plurality of first channel patterns on the first active region, the plurality of first channel patterns spaced apart from each other in the first direction;
a second channel pattern on the second active region;
a gate electrode extending in the first direction running across the first and second active regions, the gate electrode surrounding the plurality of first channel patterns and the second channel pattern;
a first power line extending in a second direction intersecting the first direction, the first power line running across the first active region and the gate electrode;
a second power line adjacent to the second active region, the second power line extending in the second direction and spaced apart from the first power line in the first direction,
wherein a width in the first direction of the first active region is greater than a width in the first direction of the second active region; and
third active regions protruding upwardly from the substrate and spaced apart from each other in the first direction, wherein the third active regions extend in the second direction to come into connection with the first active region.

2. The semiconductor device of claim 1, wherein the first active region has a first conductive type, and the second active region has a second conductive type different from the first conductive type.

3. The semiconductor device of claim 1, wherein each of the first channel patterns has a width along the first direction, and
wherein the width in the first direction of the first active region is greater than a sum of the widths of the first channel patterns.

4. The semiconductor device of claim 1, further comprising:
first source/drain patterns on the first active region, the first source/drain patterns disposed on sides of the first channel patterns and spaced apart from each other in the first direction; and
a first contact plug on one side of the gate electrode and connecting the first source/drain patterns to each other,
wherein the first contact plug extends in the first direction and the first power line runs across the first contact plug.

5. The semiconductor device of claim 4, further comprising:
a second source/drain pattern on the second active region, the second source/drain pattern disposed on one side of the second channel pattern and spaced apart from the first source/drain patterns in the first direction; and
a second contact plug on the one side of the gate electrode and connected to the second source/drain pattern,
wherein the second contact plug is spaced apart from the first contact plug in the first direction.

6. The semiconductor device of claim 1, wherein the second active region has a linear shape that extends in the second direction,
wherein the first active region and the third active regions are disposed on one side of the second active region, and
wherein the third active regions are spaced apart from the second active region in the first direction.

7. The semiconductor device of claim 6, wherein the first active region and the third active regions have a first conductive type, and the second active region has a second conductive type different from the first conductive type.

8. The semiconductor device of claim 6, wherein the width in the first direction of the first active region is greater than a width in the first direction of each of the third active regions.

9. The semiconductor device of claim 8, wherein the width in the first direction of the first active region is greater than a sum of the widths in the first direction of the third active regions.

10. The semiconductor device of claim 6, further comprising:
third channel patterns respectively disposed on the third active regions,
wherein the third channel patterns are spaced apart from each other in the first direction.

11. The semiconductor device of claim 10, further comprising:
third source/drain patterns respectively disposed on the third active regions, and respectively disposed on sides of the third channel patterns,
wherein the third source/drain patterns are spaced apart from each other in the first direction.

12. The semiconductor device of claim 11, further comprising:
third contact plugs respectively disposed on the third source/drain patterns, and respectively connected to the third source/drain patterns,
wherein the third contact plugs are spaced apart from each other in the first direction.

13. The semiconductor device of claim 6, wherein the first power line extends in the second direction between the third active regions, when viewed in a plane.

14. A semiconductor device, comprising:
a first active region;
second active regions spaced apart from each other in a first direction across the first active region;
a plurality of first channel patterns on the first active region, the plurality of first channel patterns spaced apart from each other in the first direction;
a second channel pattern on each the second active regions;
a gate electrode extending in the first direction running across the first active region and the second active regions, the gate electrode surrounding the plurality of first channel patterns and the second channel pattern;
a first power line extending in a second direction intersecting the first direction, the first power line running across the first active region and the gate electrode; and
second power lines spaced apart from each other in the first direction across the first power line,
wherein the second power lines are disposed adjacent to the second active regions, respectively,
wherein a width in the first direction of the first active region is greater than a width in the first direction of each of the second active regions.

15. The semiconductor device of claim 14, wherein the first active region has a first conductive type, and the second active regions have a second conductive type different from the first conductive type.

16. The semiconductor device of claim 14, further comprising:
first source/drain patterns on the first active region, the first source/drain patterns disposed on sides of the first channel patterns and spaced apart from each other in the first direction; and
a first contact plug on one side of the gate electrode and connecting the first source/drain patterns to each other,
wherein the first contact plug extends in the first direction and the first power line runs across the first contact plug.

17. The semiconductor device of claim 16, further comprising:
a second source/drain pattern on each of the second active regions, the second source/drain pattern disposed on one side of the second channel pattern and spaced apart from the first source/drain patterns in the first direction; and
a second contact plug on the one side of the gate electrode and connected to the second source/drain pattern,
wherein the second contact plug is spaced apart from the first contact plug in the first direction.

18. The semiconductor device of claim 14, further comprising:
third active regions spaced apart from each other in the first direction between the second active regions,
wherein the third active regions are adjacent to the first active region in the second direction, and extend in the second direction to come into connection with the first active region.

19. The semiconductor device of claim 18, wherein the width in the first direction of the first active region is greater than a sum of widths in the first direction of the third active regions.

* * * * *